United States Patent
Vastmans et al.

(10) Patent No.: US 9,250,407 B2
(45) Date of Patent: Feb. 2, 2016

(54) CABLE SEALING DEVICE HAVING AUTONOMOUS SEAL CONTAINMENT

(75) Inventors: Kristof Vastmans, Boutersem (BE); Roel Modest Willy Bryon, Aarschot (BE); Pieter Arthur Anna De Vos, Berchem (BE); Wouter Vandamme, Sint Amandsberg (BE)

(73) Assignee: Tyco Electronics Raychem BVBA, Kessel-Lo (BE)

( * ) Notice: Subject to any disclaimer, the term of this patent is extended or adjusted under 35 U.S.C. 154(b) by 253 days.

(21) Appl. No.: 14/116,698

(22) PCT Filed: May 3, 2012

(86) PCT No.: PCT/EP2012/058093
§ 371 (c)(1),
(2), (4) Date: Nov. 8, 2013

(87) PCT Pub. No.: WO2012/152643
PCT Pub. Date: Nov. 15, 2012

(65) Prior Publication Data
US 2014/0072266 A1    Mar. 13, 2014

(30) Foreign Application Priority Data

May 10, 2011    (EP) .................................... 11165516

(51) Int. Cl.
*G02B 6/44*    (2006.01)
*H05K 5/06*    (2006.01)
(Continued)

(52) U.S. Cl.
CPC ............ *G02B 6/4401* (2013.01); *G02B 6/4444* (2013.01); *H02G 15/013* (2013.01); *H02G 15/076* (2013.01); *H02G 15/113* (2013.01); *H02G 15/117* (2013.01); *H05K 5/068* (2013.01)

(58) Field of Classification Search
CPC . G02B 6/4444; H02G 15/013; H02G 15/076; H05K 5/068
USPC ............... 174/17 CT, 50.5, 77 R, 135, 137 R, 174/152 G, 152 R, 155, 156, 92, 93
See application file for complete search history.

(56) References Cited

U.S. PATENT DOCUMENTS 6,046,406 A * 4/2000 Milanowski ......... H02G 15/113
174/77 R
6,802,512 B2  10/2004 Muller et al.
(Continued)

FOREIGN PATENT DOCUMENTS

EP    0442941    1/1995
EP    0587616    7/1996
(Continued)

OTHER PUBLICATIONS

International Search Report for International Application No. PCT/EP2012/058093 mailed Oct. 24, 2013 (6 pages).
(Continued)

*Primary Examiner* — William H Mayo, III
*Assistant Examiner* — Hiram E Gonzalez
(74) *Attorney, Agent, or Firm* — Merchant & Gould P.C.

(57) ABSTRACT

The present disclosure relates to a cable sealing device (30) for providing a seal about a cable (88, 90). The cable sealing device (30) includes a cable seal arrangement (38) that is pressurized to seal the cable (88, 90). The cable sealing device (30) includes an autonomous containment structure (92F, 92R, 56) for laterally and axially containing the sealing arrangement (38). The autonomous containment structure (92F, 92R, 56) includes a moveable portion (92F, 92R) that is moved to an actuated position to pressurize the cable seal arrangement (38). The cable sealing device (30) also includes a retention mechanism (129) for retaining the moveable portion (92F, 92R) in the actuated position. The autonomous containment structure (92F, 92R, 56) further includes an autonomous perimeter casing (56) mounted over the sealing arrangement (38) for laterally containing the cable sealing arrangement (38) such that the cable sealing arrangement (38) remains pressurized when the moveable portion (92F, 92R) is in the actuated position independent of whether the cable sealing device (30) is mounted within an enclosure (20). The cable sealing device (30) has a wrap-around configuration for allowing a cable (88, 90) to be laterally inserted into the cable sealing device (30).

13 Claims, 20 Drawing Sheets

(51) Int. Cl.
*H02G 15/013* (2006.01)
*H02G 15/076* (2006.01)
*H02G 15/113* (2006.01)
*H02G 15/117* (2006.01)

(56) References Cited

U.S. PATENT DOCUMENTS 7,799,995 B2 * 9/2010 Mullaney .............. G02B 6/4447 174/77 R
2006/0202434 A1 * 9/2006 Willems ............... H02G 15/013 277/606
2009/0309313 A1 12/2009 Knorr et al.

FOREIGN PATENT DOCUMENTS

| WO | WO 92/22114 | 12/1992 |
| WO | WO 97/02635 | 1/1997 |
| WO | WO 97/42693 | 11/1997 |
| WO | WO 01/41276 | 6/2001 |
| WO | WO 2007/118548 | 10/2007 |

OTHER PUBLICATIONS

European Search Report for EP application No. 11165516.3 mailed Feb. 28, 2012 (12 pages).

* cited by examiner

CABLE SEALING DEVICE HAVING AUTONOMOUS SEAL CONTAINMENT

This application is a National Stage Application of PCT/EP2012/058093, filed 3 May 2012, which claims benefit of Serial No. 11165516.3, filed 10 May 2011 in Europe and which applications are incorporated herein by reference. To the extent appropriate, a claim of priority is made to each of the above disclosed applications.

Telecommunications systems typically employ a network of telecommunications cables capable of transmitting large volumes of data and voice signals over relatively long distances. The telecommunications cables can include fiber optic cables, electrical cables, or combinations of electrical and fiber optic cables. A typical telecommunications network also includes a plurality of telecommunications enclosures integrated throughout the network of telecommunications cables. The telecommunications enclosures are adapted to house and protect telecommunications components such as splices, termination panels, power splitters and wavelength division multiplexers. It is often preferred for the telecommunications enclosures to be re-enterable. The term "re-enterable" means that the telecommunications enclosures can be reopened to allow access to the telecommunications components housed therein without requiring the removal and destruction of the telecommunications enclosures. For example, certain telecommunications enclosures can include separate access panels that can be opened to access the interiors of the enclosures, and then closed to re-seal the enclosures. Other telecommunications enclosures take the form of elongated sleeves formed by wrap-around covers or half-shells having longitudinal edges that are joined by clamps or other retainers. Still other telecommunications enclosures include two half-pieces that are joined together through clamps, wedges or other structures.

Telecommunications enclosures are typically sealed to inhibit the intrusion of moisture or other contaminants. Pressurized gel-type seals have been used to effectively seal the locations where telecommunications cables enter and exit telecommunications enclosures. Example pressurized gel-type seals are disclosed by document EP 0442941 B1 and document EP 0587616 B1. Both of these documents disclose gel-type cable seals that are pressurized through the use of threaded actuators. The cable seals include gel-blocks that mount within telecommunications enclosures and rely on the telecommunications enclosures to provide containment of the gel-blocks as the gel-blocks are pressurized. While pressurized cable seals have generally proven to be effective, improvements in this area are still needed.

The present disclosure relates to a cable sealing device for providing a seal about a cable. The cable sealing device includes a cable seal arrangement that is pressurized to seal the cable. The cable sealing device includes an autonomous containment structure for laterally and axially containing the sealing arrangement. The autonomous containment structure includes a moveable portion that is moved to an actuated position to pressurize the cable seal arrangement. The cable sealing device also includes a retention mechanism for retaining the moveable portion in the actuated position. The autonomous containment structure further includes an autonomous perimeter casing mounted over the sealing arrangement for laterally containing the cable sealing arrangement such that the cable sealing arrangement remains pressurized when the moveable portion is in the actuated position independent of whether the cable sealing device is mounted within an enclosure. The cable sealing device has a wrap-around configuration for allowing a cable to be laterally inserted into the cable sealing device. The cable sealing device increases seal life and preserves seal integrity by not requiring the cable seal to be disturbed each time the enclosure is opened.

In certain embodiments, the cable sealing device further includes a perimeter seal that extends about an exterior of the autonomous perimeter casing. In further embodiments, the perimeter seal is connected to the cable seal arrangement by legs that extend through the autonomous perimeter casing. In other embodiments, the autonomous perimeter casing has a rigid construction and includes a base piece that extends under the cable seal arrangement and two bridge pieces that extend over the cable seal arrangement. In still other embodiments, the bridge pieces have lower ends hooked to the base piece and upper ends that fasten together. In further embodiments, the cable sealing arrangement includes a main central sealing member, positioned axially between the first and second compression plates, a lower sealing member, positioned between the main central sealing member and the base piece, and upper sealing members, positioned between the main central sealing members and the bridge pieces. In still other embodiments, the lower sealing member is carried by the base piece when the cable sealing device is disassembled, and the upper sealing members are carried by the bridge pieces when the cable sealing device is disassembled. In further embodiments, first and second compression plates are captured within the autonomous perimeter casing.

Another aspect of the present disclosure relates to a re-enterable telecommunications enclosure including a cable sealing device. The enclosure includes first and second housing pieces that are moved relative to one another to re-enter the telecommunications enclosure. The cable sealing device is mounted inside an opening defined at least in part by the first and second housing pieces. The telecommunications enclosure includes a seal that surrounds an exterior of the autonomous perimeter casing and is compressed between the first and second housing pieces and the autonomous perimeter casing.

In further embodiments, the telecommunication enclosure can be re-entered without decompressing the cable seal arrangement within the autonomous perimeter casing. In other embodiments, the first and second housing pieces include a base piece and a cover piece having flanges that are secured together.

A further aspect of the present disclosure relates to a re-enterable telecommunications enclosure that includes a cable sealing device. The telecommunications enclosure is configured such that when the telecommunications enclosure is re-entered, a seal surrounding the cable sealing device is decompressed while the cable seal arrangement inside the autonomous perimeter casing remains pressurized.

Still another aspect of the present disclosure relates to a re-enterable telecommunications enclosure that includes a re-enterable housing. The telecommunications enclosure includes a cable seal arrangement for sealing a cable that enters the housing. Closing the housing automatically causes the cable seal arrangement to be in a compressed state, and the telecommunications enclosure includes a retention mechanism that retains the cable seal arrangement in the compressed state when the telecommunications enclosure is re-entered.

Figure 1:
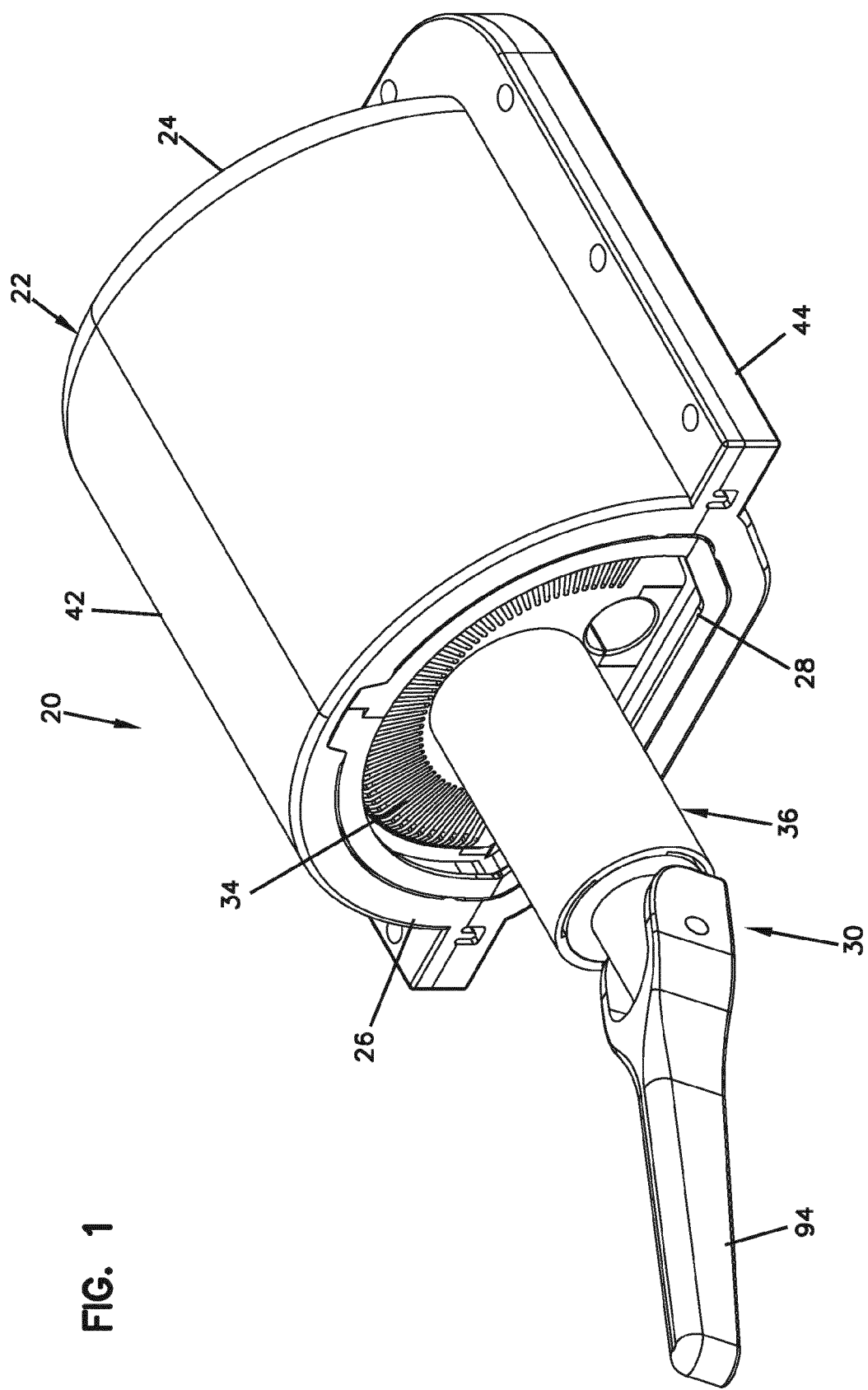
FIG. 1 is a front, top perspective view of a telecommunications enclosure in accordance with the principles of the present disclosure.
Figure 2:
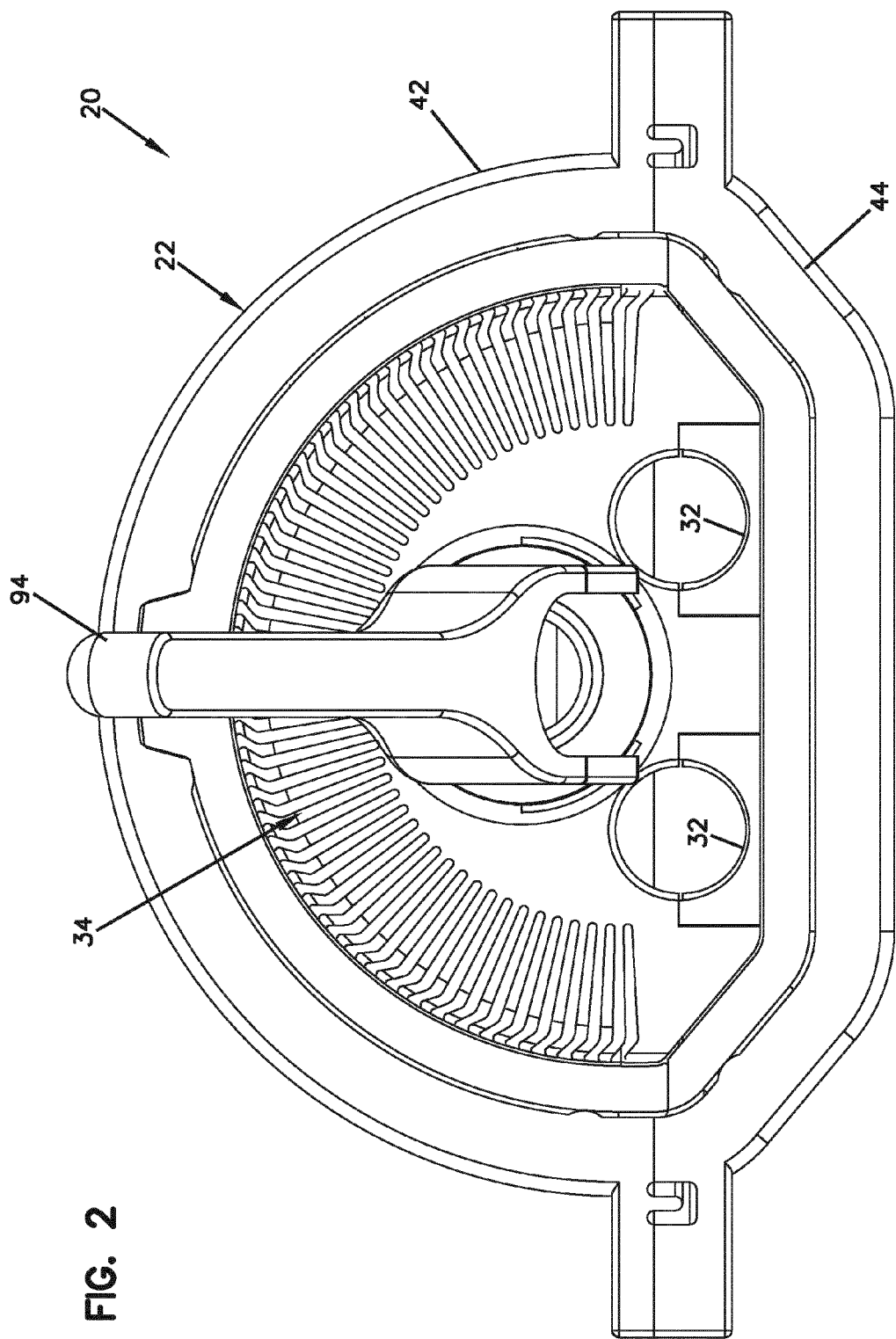
FIG. 2 is a front, elevation view of the telecommunications enclosure of FIG. 1.
Figure 3:
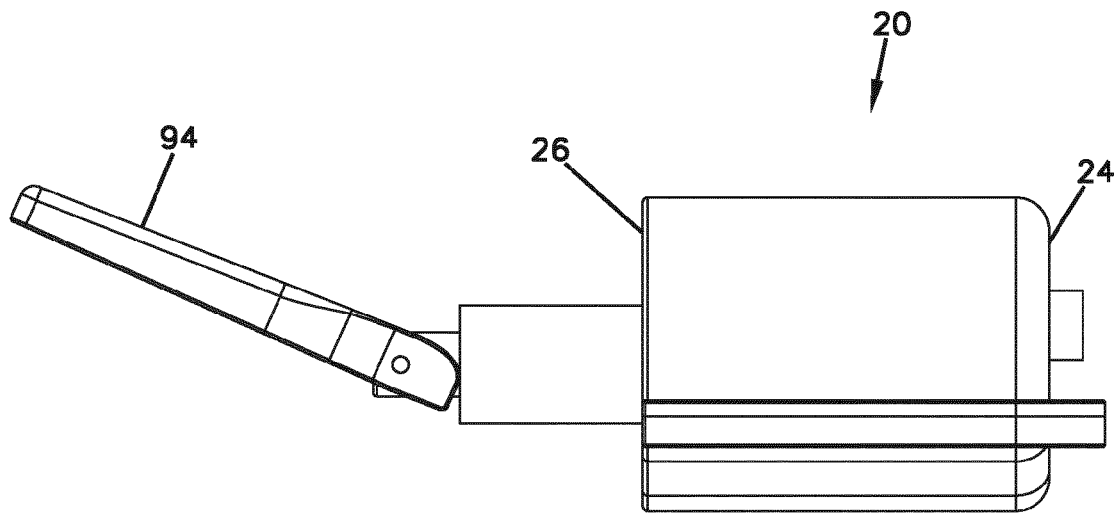
FIG. 3 is a side, elevation view of the telecommunications enclosure of FIG. 1.
Figure 4:
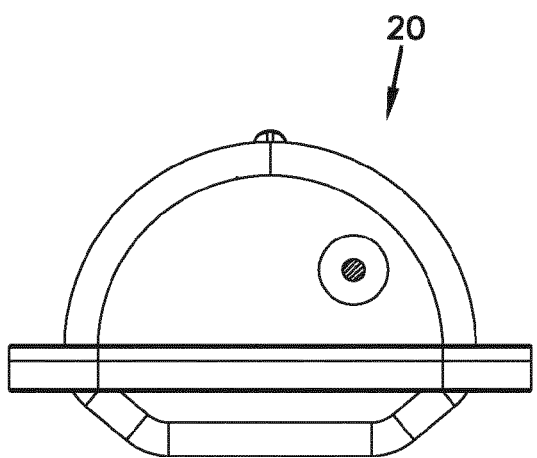
FIG. 4 is a rear, elevation view of the telecommunications enclosure of FIG. 1.
Figure 5:
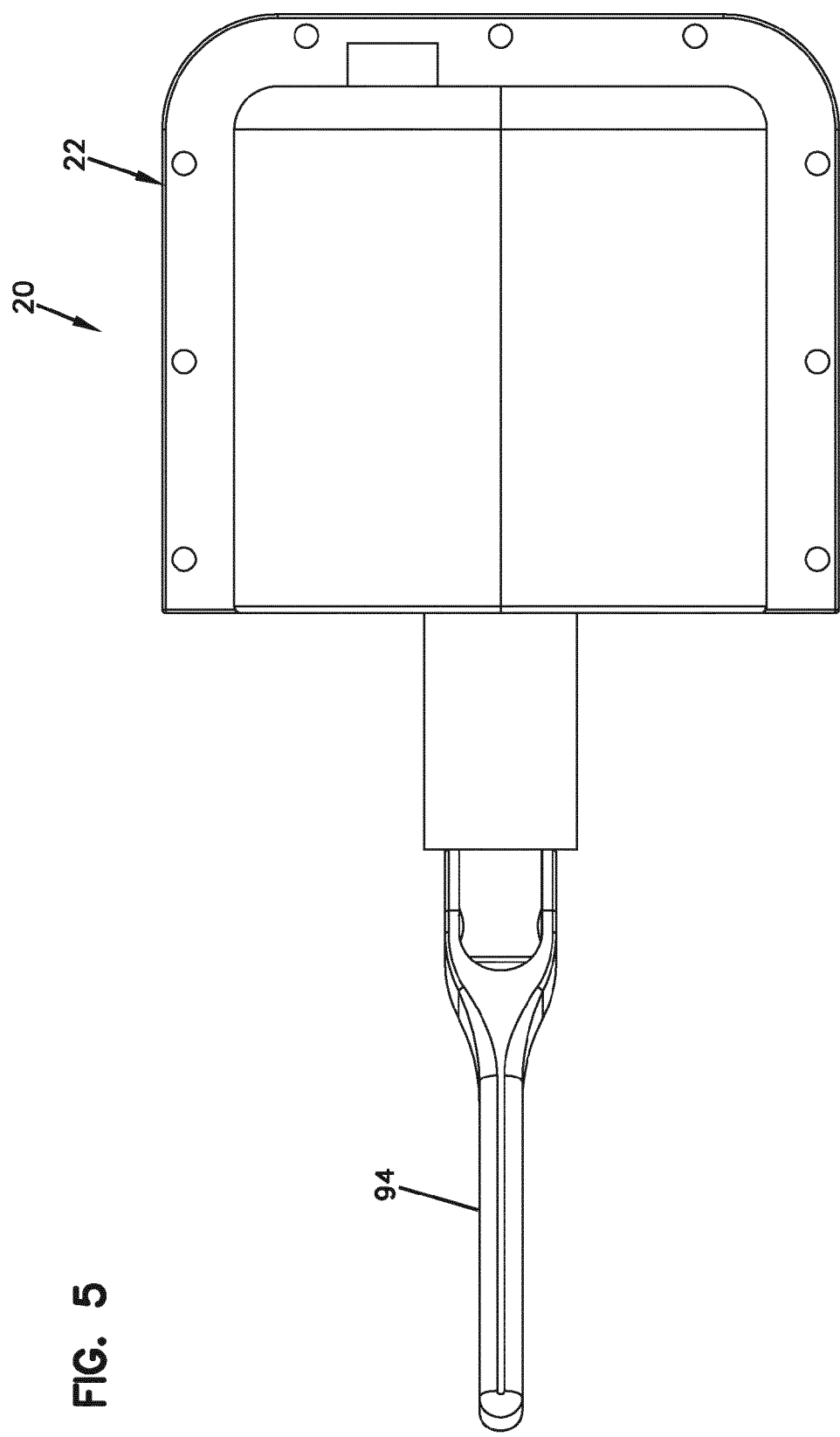
FIG. 5 is a top, plan view of the telecommunications enclosure of FIG. 1.
Figure 6:
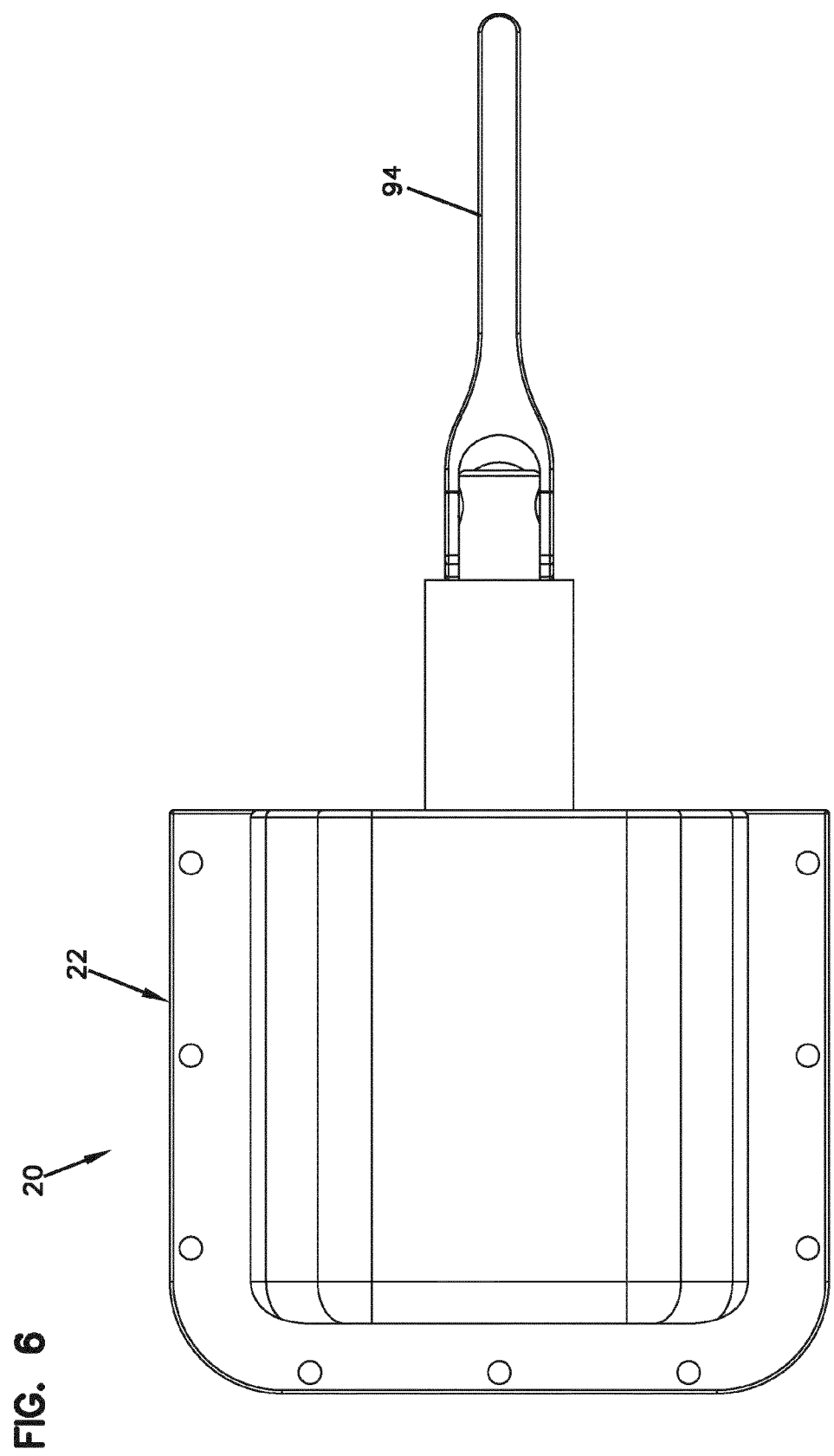
FIG. 6 is a bottom, plan view of the telecommunications enclosure of FIG. 1.

FIGS. 1-6 illustrate a telecommunications enclosure 20 in accordance with the principles of the present disclosure. The telecommunications enclosure 20 is adapted for housing and protecting telecommunications optical and/or electrical components such as splices (e.g., mechanical splices, fusion splices, etc.), power splitters, multiplexing components (e.g., wavelength division multiplexers (WDM's)) or other components. The telecommunications enclosure 20 is preferably environmentally sealed to inhibit the intrusion of moisture, dust or other contaminants. Sealed cable entry/exit locations are preferably provided for allowing telecommunications cables (e.g., fiberoptic cables, electrical cables, etc.) to be routed into and out of the telecommunications enclosure 20 without compromising the overall environmentally sealed nature of the telecommunications enclosure 20. In the depicted embodiment, the telecommunications enclosure 20 is a butt-style enclosure in which cables are routed through only one end of the telecommunications enclosure 20. In-line pass-through enclosures in which telecommunications cables can be routed through opposite ends of the enclosure are also contemplated to be within the scope of the present disclosure.

Referring still to FIGS. 1-6, the telecommunications enclosure 20 includes a main housing 22 having a first end 24 and an opposite second end 26. The first end 24 of the main housing 22 is closed while the second end 26 defines an opening 28 in which a cable sealing device 30 is mounted. The cable sealing device 30 includes central cable ports 32 for allowing larger cables (e.g., trunk fiberoptic cables, feeder cables, distribution cables, etc.) to be routed into and/or out of the main housing 22. The cable sealing device 30 further includes a peripheral cable passage region 34 for allowing smaller profile cables (e.g., drop cables) to enter and/or exit the main housing 22. The cable sealing device 30 also includes an actuator 36 for use in compressing a cable seal arrangement 38 of the cable sealing device 30 so as to provide environmental seals about each of the cables routed through the cable sealing device 30.

Figure 7:
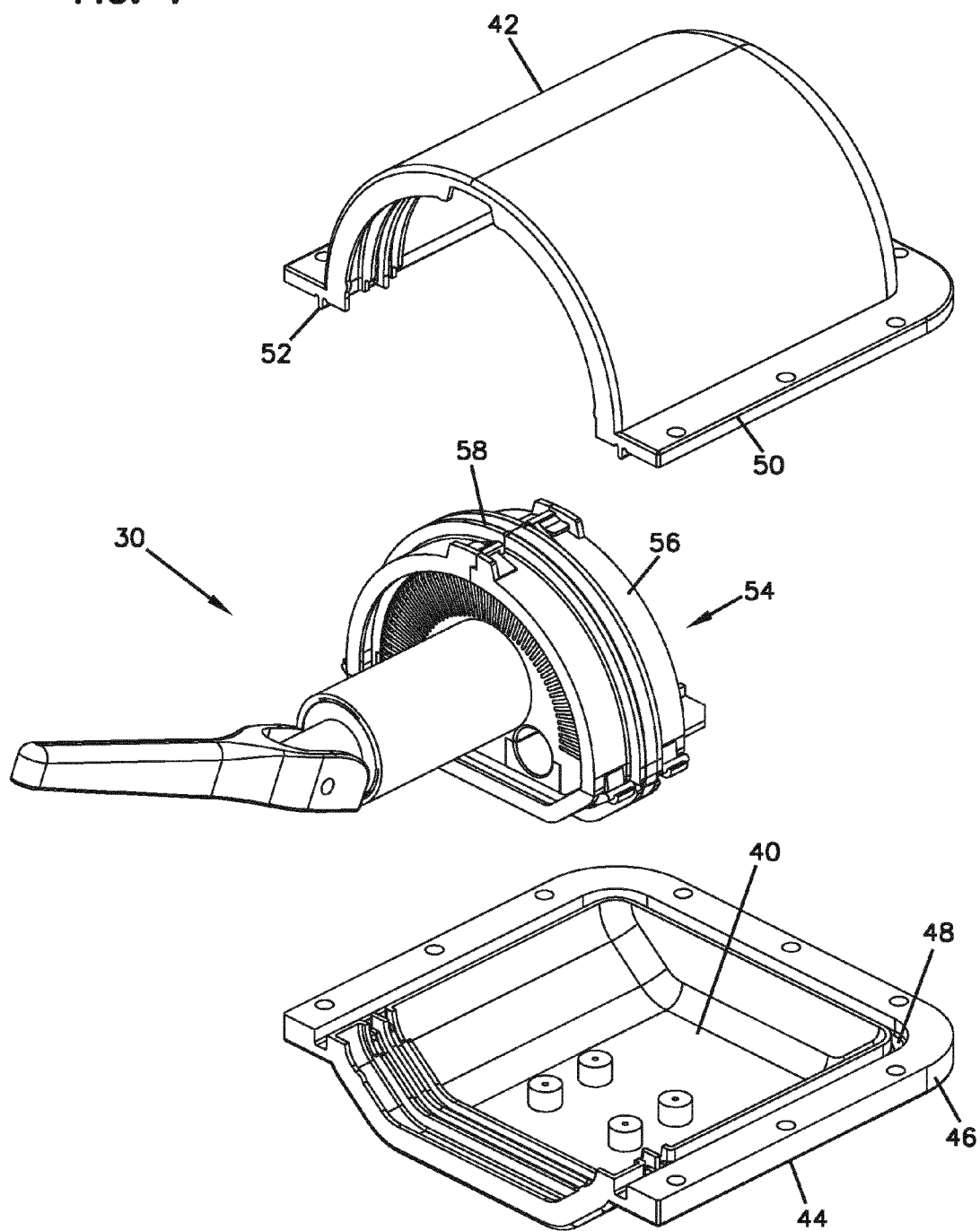
FIG. 7 is an exploded view of the telecommunications enclosure of FIG. 1 showing a main housing exploded outwardly from a cable sealing device.

Referring to FIG. 7, the main housing 22 defines an interior region 40 for housing components (e.g., optical or electrical components) of the type described above. The main housing 22 includes a cover piece 42 that mounts to a base piece 44. The base piece 44 includes a base flange 46 that extends around a perimeter of the interior region 40. The base flange 46 defines a groove 48 for receiving a sealing member. The cover piece 42 includes a cover flange 50 that abuts against the base flange 46 when the cover piece 42 is attached to the base piece 44. The cover flange 50 includes a seal compression member 52 that fits within the groove 48 when the cover piece 42 is secured to the base piece 44. The seal compression member 52 functions to compress the sealing member within the groove 48 to provide an effective environmental seal between the cover piece 42 and the base piece 44. It will be appreciated that the cover piece 42 and the base piece 44 can be secured together by a variety of mechanical means. Example mechanical means include fasteners extending through the base flange 46 and the cover flange 50, clamps, latches, or other structures. It is preferred for the mechanical means to allow the main housing 22 to be re-enterable.

Referring still to FIG. 7, the cable sealing device 30 mounts within the opening 28 at the second end 26 of the main housing 22. The cable sealing device 30 includes a cable sealing unit 54 having a perimeter casing 56 that laterally surrounds the cable seal arrangement 38. The perimeter casing 56 can also be referred to as a boundary element, a containment element, a boundary structure, containment structure or like terms. The perimeter casing 56 preferably has a relatively rigid construction and functions to laterally contain and enclose the cable seal arrangement 38. An outer sealing element 58 circumscribes an exterior of the perimeter casing 56. When the cable sealing device 30 is mounted within the opening 28 of the main housing 22, the cable sealing device 30 is captured between the cover piece 42 and the base piece 44 of the main housing 22. When the cover piece 42 and the base piece 44 are secured together with the cable sealing device captured thereinbetween, the outer sealing element 58 is compressed thereby providing a circumferential seal between the main housing 22 and the perimeter casing 56 of the cable sealing unit 54.

Figure 8:
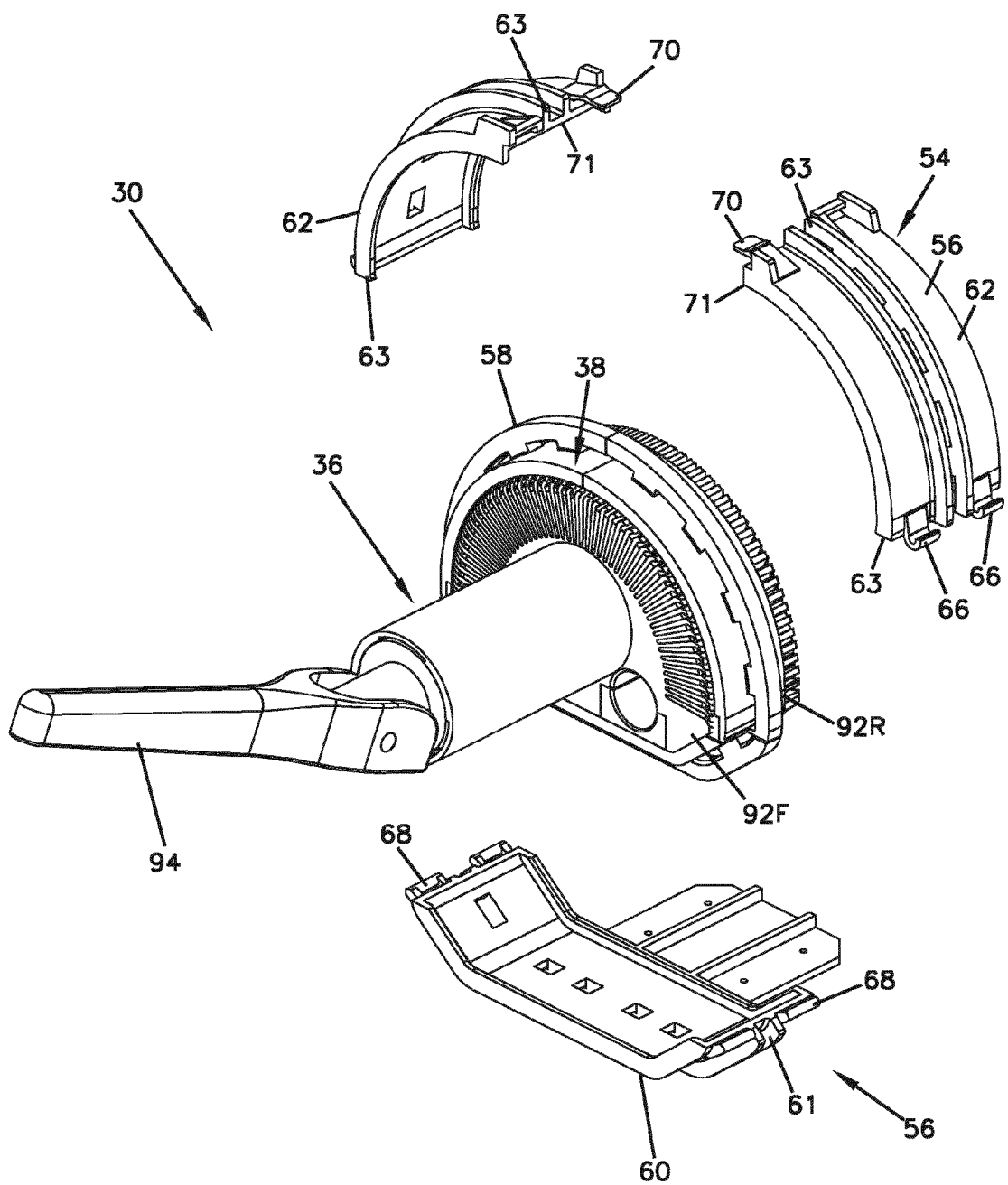
FIG. 8 is a perspective view showing the cable sealing device of FIG. 7 with a peripheral casing exploded outwardly from the remainder of the cable sealing device.

Referring to FIG. 8, the perimeter casing 56 of the cable sealing unit 54 includes a base piece 60 and two bridge pieces 62. The bridge pieces 62 include lower ends 65 having lower hooks 66 that engage catches 68 of the base piece 60 to secure the bridge pieces 62 to the base piece 60. The bridge pieces 62 also include upper latches 70 (e.g., snap fit latches) for latching together upper ends 71 of the bridge pieces 62. When the bridge pieces 62 and the base piece 60 are secured together to form the perimeter casing 56, the resultant structure has a rigid construction capable of autonomously (i.e., independently) constraining and containing the cable seal arrangement 38 when the cable seal arrangement 38 is compressed to a level suitable for providing effective environmental sealing about cables routed through the cable seal arrangement 38. As used above, the terms "autonomous" or "independent" mean that the perimeter casing 56 is capable of constraining and containing the cable seal arrangement 38 as described above without the assistance of other outside structures such as the main housing 22. Because of the autonomous containment provided by the perimeter casing 56, the cable seal arrangement 38 can be fully pressurized through the use of the actuator 36 even when the cable sealing device is not mounted within the main housing 22. Additionally, the autonomous containment provided by the perimeter casing 56 allows the cable seal arrangement 38 to remain fully pressurized even when the main housing 22 is opened for re-entry. Thus, the cable seal arrangement 38 is only pressurized and depressurized through use of the actuator 36 (e.g., when it is desired to add a cable, remove a cable or adjust the existing cables). Minimizing the frequency that the cable seals are disturbed can assist in preventing the cable seals from becoming compromised over time.

Figure 9:
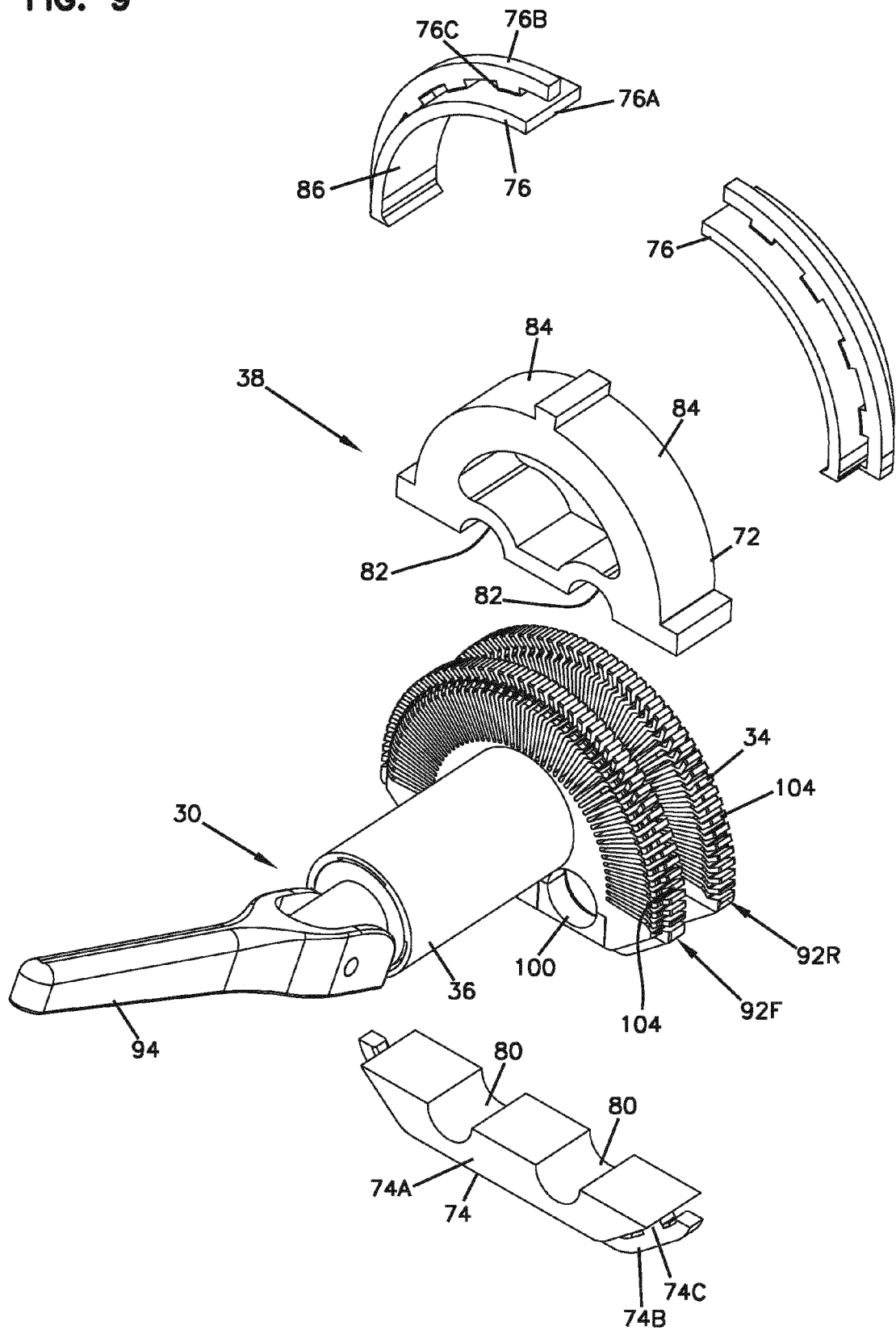
FIG. 9 is an exploded view of the cable sealing device of FIG. 7 showing a cable sealing arrangement exploded outwardly from an actuator of the cable sealing device.

Referring to FIG. 9, the cable seal arrangement 38 of the cable sealing device 30 includes a central sealing member 72, a lower sealing member 74, and two upper sealing members 76. The sealing members can be referred to as sealing blocks, sealing elements, sealing components, sealing structures or like terms. It is preferred for each of the sealing members to have a flowable or resilient construction that allows the sealing members to flow and/or deform when compressed so as to fill any void areas within the volume defined by the perimeter casing 56.

As shown at FIGS. 8 and 9, the upper sealing members 76 are shown separate from the bridge pieces 62 and the lower sealing member 74 is shown separate from the base piece 60. In certain embodiments, the upper sealing members 76 can be integrated with the bridge pieces 62 and the lower sealing member 74 can be integrated with the base piece 60 through the use of a co-molding process. For example, the lower sealing member 74 can include an inner portion 74A molded inside the base piece 60 and an outer portion 74B molded within an outer channel 61 defined by the base piece 60. The inner portion 74A and the outer portion 74B of the lower sealing member 74 are interconnected by radial legs 74C that extend through corresponding openings defined through the base piece 60. Similarly, the upper sealing members 76 include inner portions 76A molded inside the bridge pieces 62 and outer portions 76B molded within outer channels 63 defined by the bridge pieces 62. The outer portions 76B are connected to the inner portions 76A by radial leg portions 76C that extend through corresponding openings defined by the bridge pieces 62. The outer portions 76B of the upper sealing members 76 and the outer portion 74B of the lower sealing member 74 cooperate to define the outer sealing element 58 that circumscribes the perimeter casing 56.

A bottom side of the central sealing member 72 cooperates with a top side of the lower sealing member 74 to provide circumferential seals about the peripheries (e.g., outer diameters) of cables routed through the central cable ports 32. More specifically, the upper side of the lower sealing member 74 defines two half-openings 80 that align with corresponding half-openings 82 defined by the bottom side of the central sealing member 72. The half-openings 80, 82 cooperate to define the central cable ports 32. When the central sealing member 72 and the lower sealing member 74 are compressed within the perimeter casing 56 while cables are routed through the central cable ports 32, the central sealing member 72 and the lower sealing member 74 deform and/or flow about the cables to effectively provide circumferential sealing about the outer diameters of the cables. When cables are not routed through the central cable ports 32, it will be appreciated that the central cable ports 32 can be closed by temporary plugs.

The peripheral cable passage region 34 is defined between a top side of the central sealing member 72 and bottom sides of the upper sealing members 76. More particularly, peripheral cables can be routed between outwardly facing sealing surfaces 84 (e.g., convex sealing surfaces) of the central sealing member 72 and inwardly facing sealing surfaces 86 (e.g., concave sealing surfaces) defined by the upper sealing members 76. When the central sealing members 72 and the upper sealing members 76 are compressed while cables are routed thereinbetween, the central sealing members 72 and the upper sealing members 76 deform and/or flow within the volume defined by the perimeter casing 56 so as to fill voids around the cables thereby forming effective seals about outer peripheries of the cables.

Figure 10:
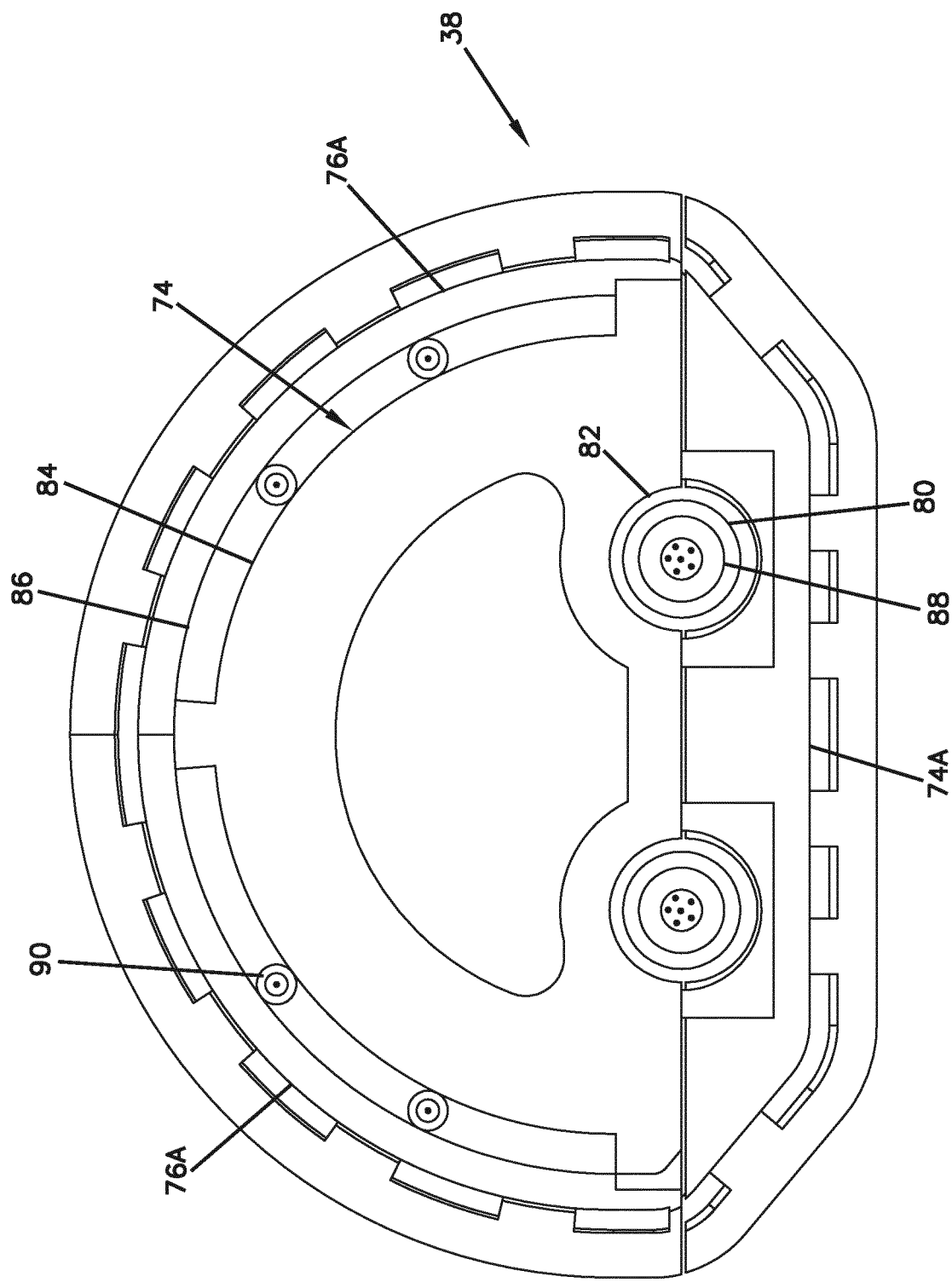
FIG. 10 is a front, elevation view of the cable sealing arrangement of the cable sealing device of FIG. 7, the cable sealing arrangement is shown in a non-pressurized state.
Figure 11:
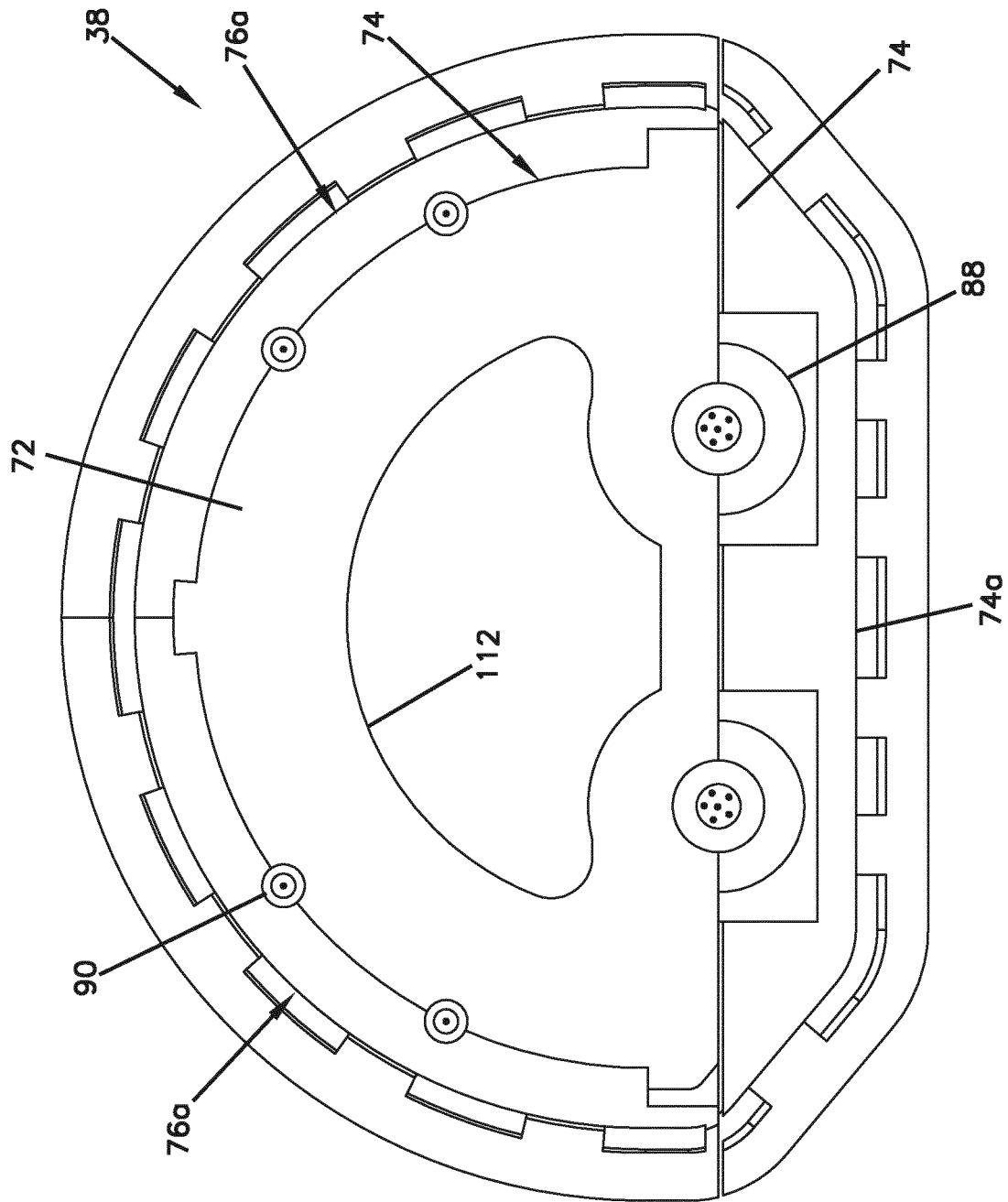
FIG. 11 shows the cable sealing arrangement of FIG. 10 in a pressurized state.

FIG. 10 shows the cable seal arrangement 38 in a non-pressurized state. Main cables 88 are shown routed through the central cable ports 32 and a plurality of peripheral cables 90 are shown routed through the peripheral cable passage region 34. When the cable seal arrangement 38 is pressurized, the cable sealing arrangement flows and/or deforms to fill voids about the main cables 88 and the peripheral cables 90 and to effectively provide seals about outer jackets of the cables. FIG. 11 schematically shows the cable seal arrangement 38 in a pressurized state in which the central sealing member 72, the lower sealing member 74, and the upper sealing members 76 have flowed to a sealing configuration in which seals are provided about jackets of the main cables 88 and the peripheral cables 90. While the peripheral cables 90 have generally been depicted as having circular outer diameters, it will be appreciated that cables having other types of transverse sectional profiles (e.g., elongated cross-sections as often seen in flat drop cables) can also be accommodated at the peripheral cable passage region 34.

Figure 12:
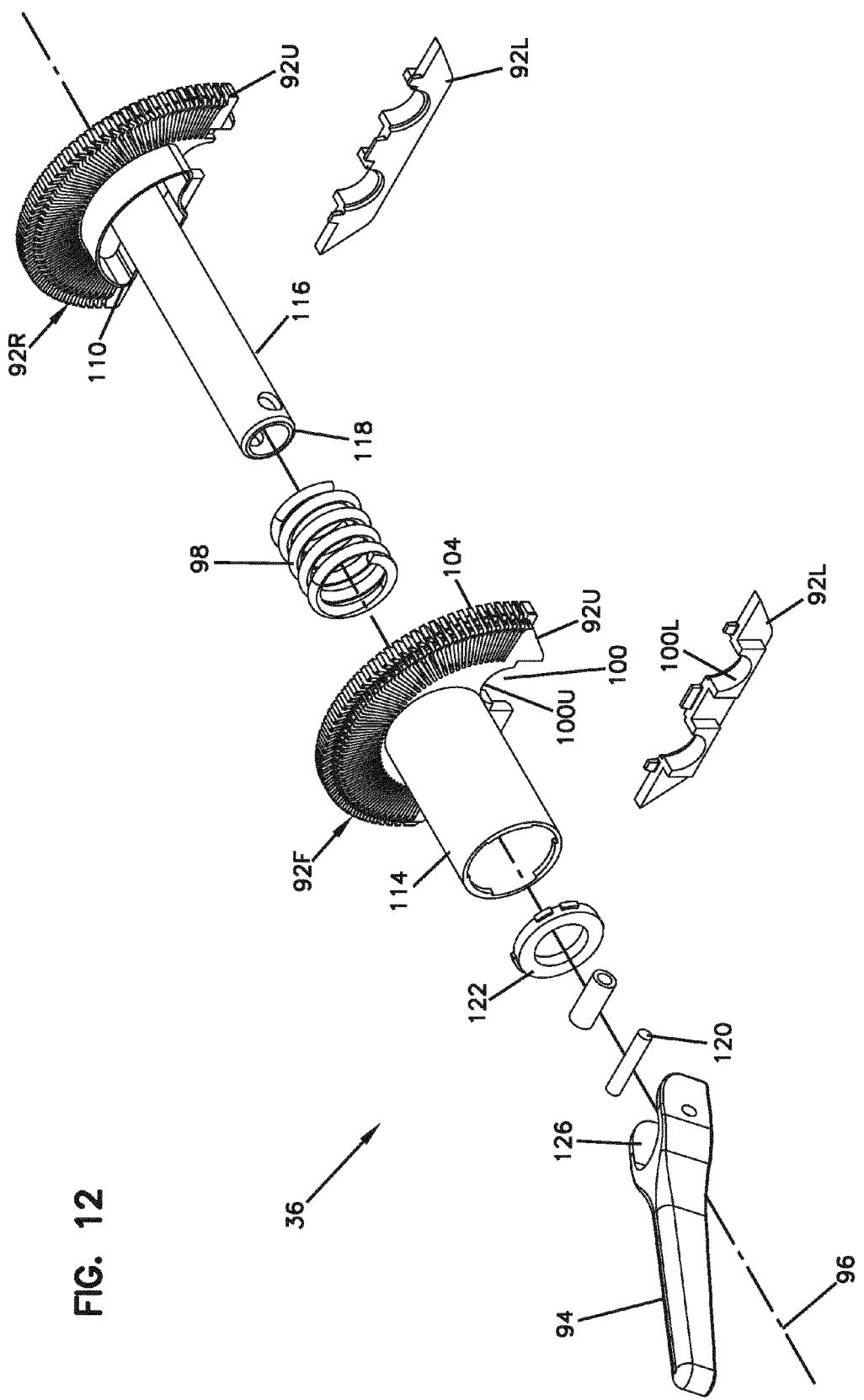
FIG. 12 is an exploded view of the actuator of the cable sealing device of FIG. 7.
Figure 13:
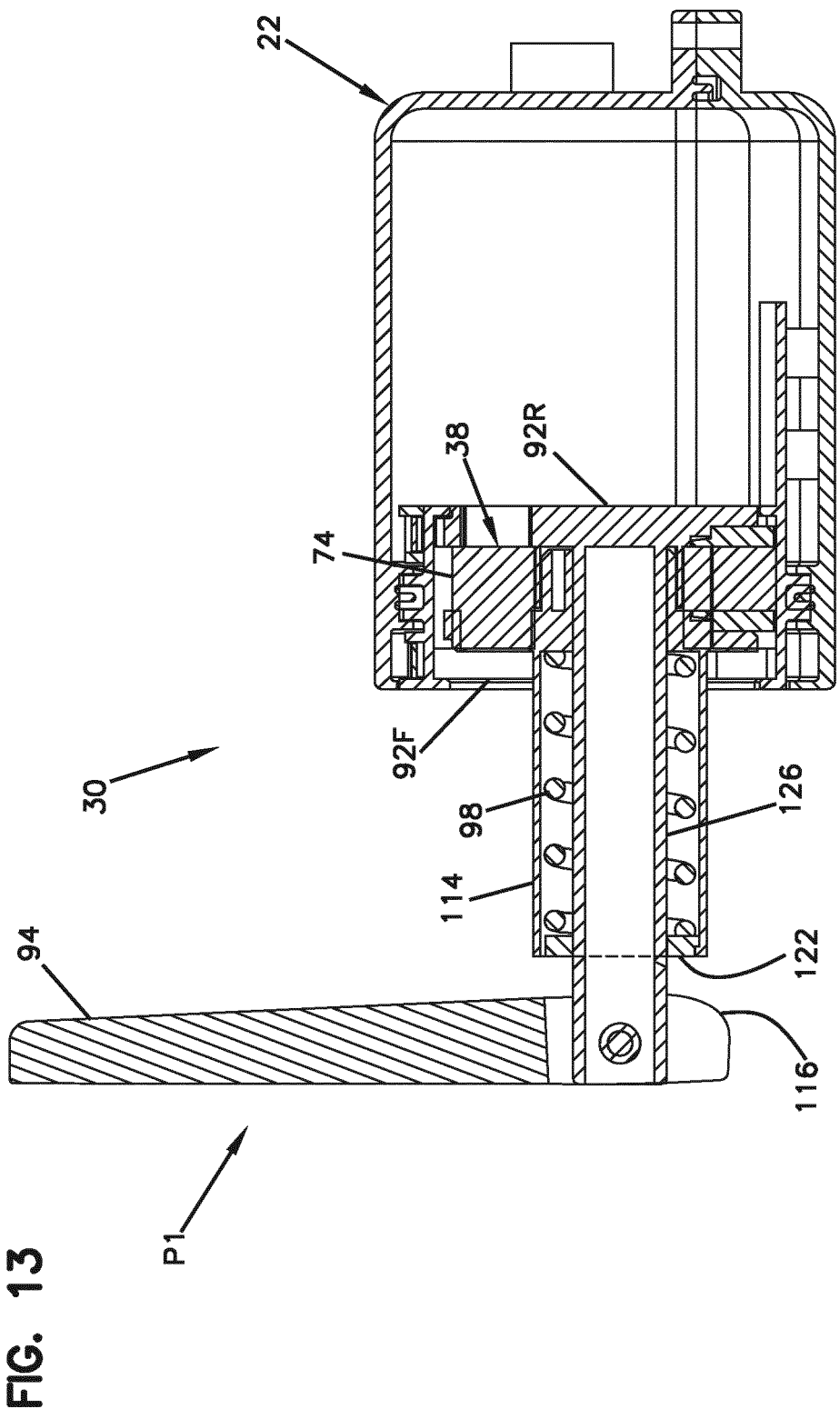
FIG. 13 is a cross-sectional view of the telecommunications enclosure of FIG. 1 with a cam lever of the telecommunications enclosure in a non-actuated state, the cross-section is taken along a vertical cross-section plane that longitudinally bisects the telecommunications enclosure.
Figure 14:
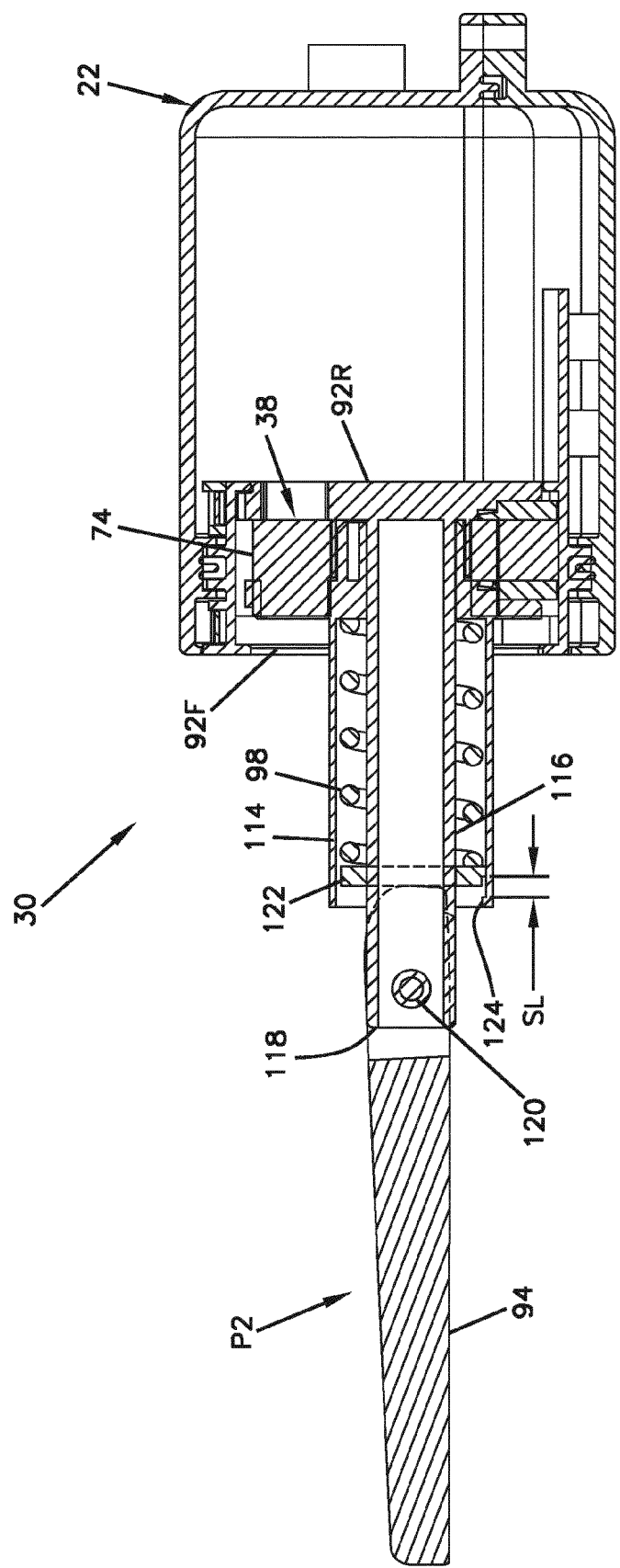
FIG. 14 is a cross-sectional view showing the telecommunications enclosure of FIG. 1 with the cam lever in an actuated state, the cross-section is taken along a vertical cross-section plane that longitudinally bisects the telecommunications enclosure.

Referring to FIGS. 12-14, the actuator 36 of the cable sealing device 30 includes a front compression plate 92F and a rear compression plate 92R between which the cable seal arrangement 38 is mounted. The front compression plate 92F and the rear compression plate 92R can be referred to as axial containment walls. The actuator 36 also includes a cam lever 94 that is pivotally movable between a non-actuated position P1 (see FIG. 13) and an actuated position P2 (see FIG. 14). Movement of the cam lever 94 from the non-actuated position to the actuated position forces the front compression plate 92F and the rear compression plate 92R together thereby transitioning the cable sealing arrangement from the non-pressurized state (see FIG. 10) to the pressurized state (see FIG. 11). The front compression plate 92F and the rear compression plate 92R are forced together in an axial orientation along axis 96. The front compression plate 92F and the rear compression plate 92R respectively provide front and rear axial containment of the cable seal arrangement 38.

A spring 98 controls the amount of axial compressive load that can be applied to the cable seal arrangement 38 by the front compression plate 92F and the rear compression plate 92R. It will be appreciated that in other embodiments, other types of actuators (e.g., screw type actuators) can be used to compress the cable seal arrangement 38. The spring 98 has a stroke length SL.

The front compression plate 92F and the rear compression plate 92R each include an upper plate portion 92U and a lower plate portion 92L. When the upper plate portion 92U and the lower plate portion 92L are coupled together, the upper plate portion 92U and the lower plate portion 92L work together as a single plate for applying compressive load to the cable seal arrangement 38. The upper plate portion 92U and the lower plate portion 92L cooperate to define openings 100 that correspond to the central cable ports 32. The lower plate portions 92L define lower half-openings 100L and the upper plate portions 92U define upper half-openings 100U that cooperate to define the openings 100.

The upper plate portions 92U include base regions 102 and flexible cable pass-through members 104 that project outwardly from the base regions 102. It will be appreciated that the flexible cable pass-through members 104 can be referred to as flexible arms, flexible fingers, flexible elements, or like terms. The flexible cable pass-through members 104 can have a cantilevered configuration with base ends 106 integrally connected to the base regions 102 and free ends 108 spaced radially outwardly from the base regions 102 relative to the axis 96. The flexible cable pass-through members 104 coincide with the peripheral cable passage region 34 and lengths of the flexible cable pass-through members 104 traverse the gap/interface defined between the central sealing member 72 and the upper sealing members 76. The flexible cable pass-through members 104 can flex about their base ends 106 along a plane generally perpendicular relative to the axis 96. The spacings between the flexible cable pass-through members 104 are preferably sized to prevent the cable seal arrangement 38 from flowing between the flexible cable pass-through members 104 when the cable seal arrangement 38 is pressurized. Thus, the flexible cable pass-through members 104 are effective for providing axial containment of the cable seal arrangement 38.

Figure 15:
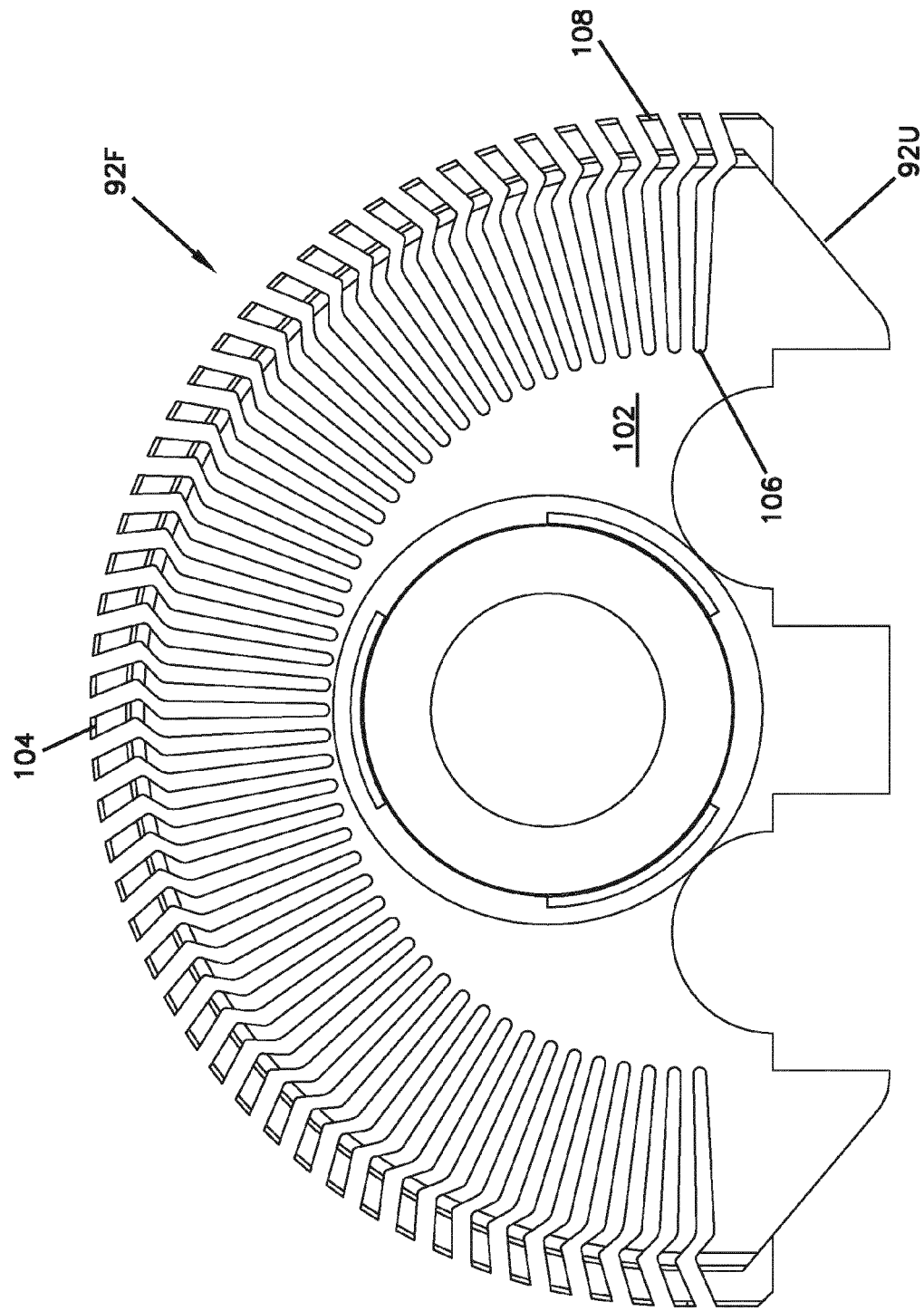
FIG. 15 is a front, elevation view of a front compression plate of the cable sealing device of FIG. 7, the front compression plate is shown with flexible cable pass-through members in a non-flexed orientation.
Figure 16:
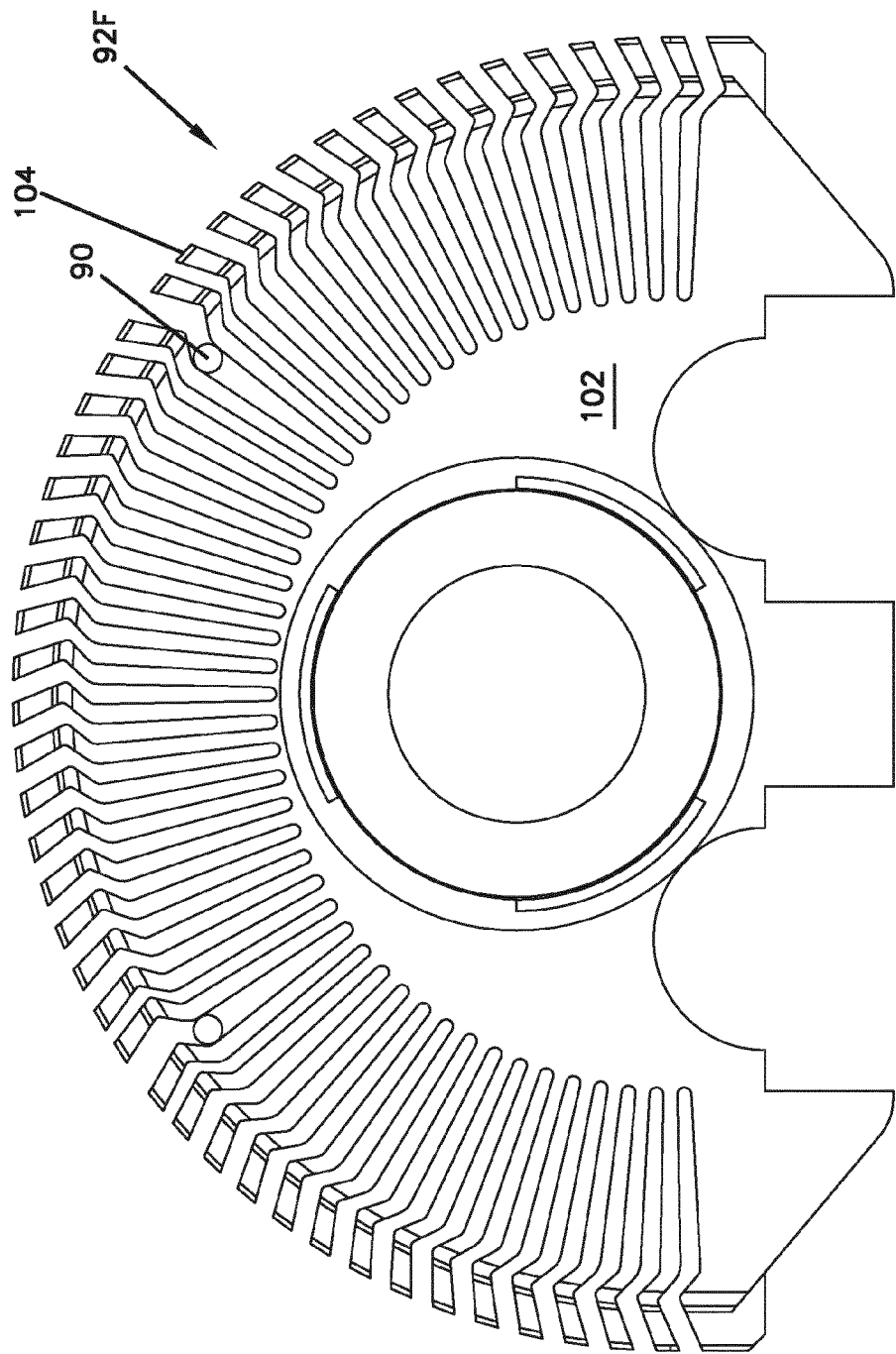
FIG. 16 shows the front compression plate of FIG. 15 with selected ones of the cable pass-through members in a flexed orientation.
Figure 17:
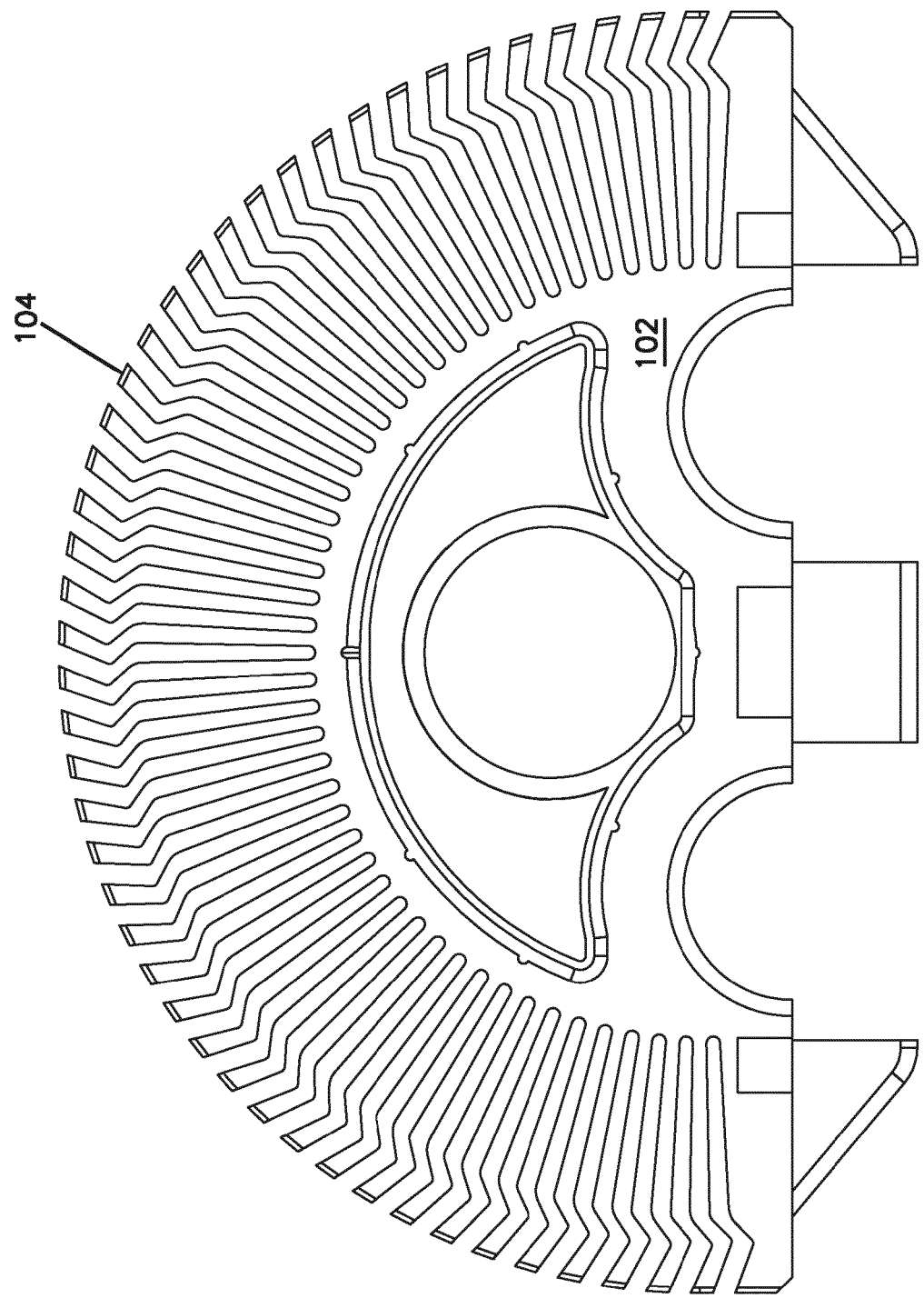
FIG. 17 is a front, elevation view of a rear compression plate of the sealing device of FIG. 7, the rear compression plate is shown with flexible cable pass-through members in a non-flexed orientation.
Figure 18:
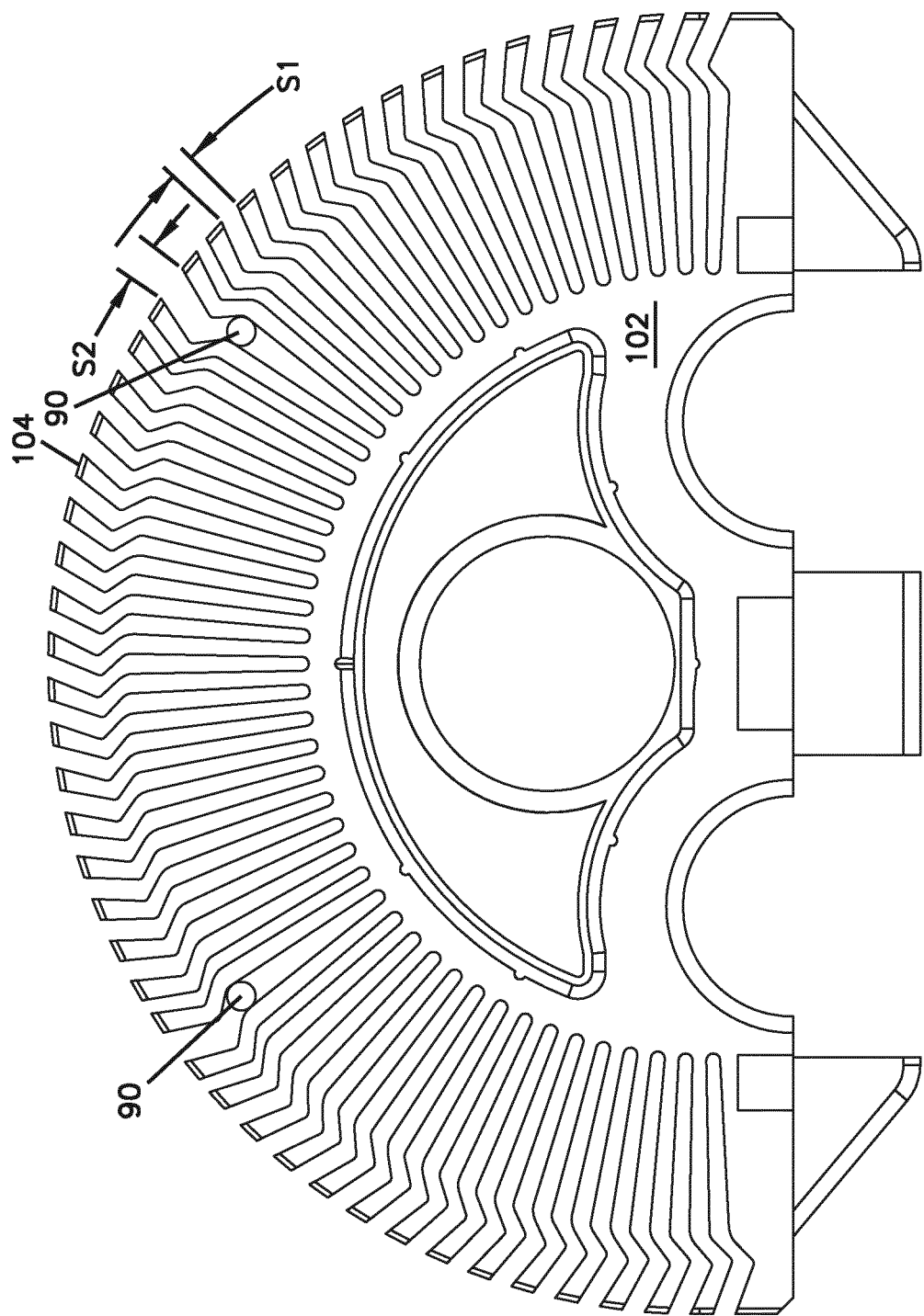
FIG. 18 shows the rear compression plate of FIG. 17 with selected ones of the cable pass-through members in flexed orientations.

The flexible nature of the flexible cable pass-through members 104 allows cables of various sizes to be routed through the peripheral cable passage region 34. For example, the flexible cable pass-through members 104 are capable of flexing apart to accommodate peripheral cables of larger size. FIG. 15 shows the upper plate portion 92U of the front compression plate 92F with no peripheral cables 90 inserted between any of the flexible cable pass-through members 104 such that the flexible members are all shown in non-flexed positions (i.e., neutral states). In contrast, FIG. 16 shows selected ones of the flexible cable pass-through members 104 of the front compression plate 92F flexed apart from their non-flexed positions to flexed positions (i.e., elastically loaded states) so as to accommodate peripheral cables 90 inserted through the peripheral cable passage region 34. Similarly, FIG. 17 shows the flexible cable pass-through members 104 of the rear compression plate 92R in non-flexed positions, and FIG. 18 shows selected ones of the flexible cable pass-through members 104 of the rear compression plate 92R flexed apart to accommodate peripheral cables 90 inserted through the peripheral cable passage region 34.

Referring still to FIGS. 15-18, the flexible cable pass-through members 104 define first spaces S1 when in the non-flexed positions and second spaces S2 when in the flexed positions. In certain embodiments, the S2 is at least 10 percent larger than S1. In other embodiments, S2 is at least 25 percent larger than S1. In other embodiments, S2 is at least 25 percent larger than S1. In still other embodiments, S2 is at least 50 percent larger than S1. In further embodiments, S2 is at least 100 percent larger than S1.

It will be appreciated that the cable sealing unit 54 has a wrap-around cable sealing configuration. A "wrap-around" cable sealing configuration is a configuration that allows cables to be radially/laterally inserted into the central cable ports 32 and the peripheral cable passage region 34. Thus, it is not required for cables to be axially threaded through the central cable ports 32 or the peripheral cable passage region 34 during installation of the cables.

Figure 19:
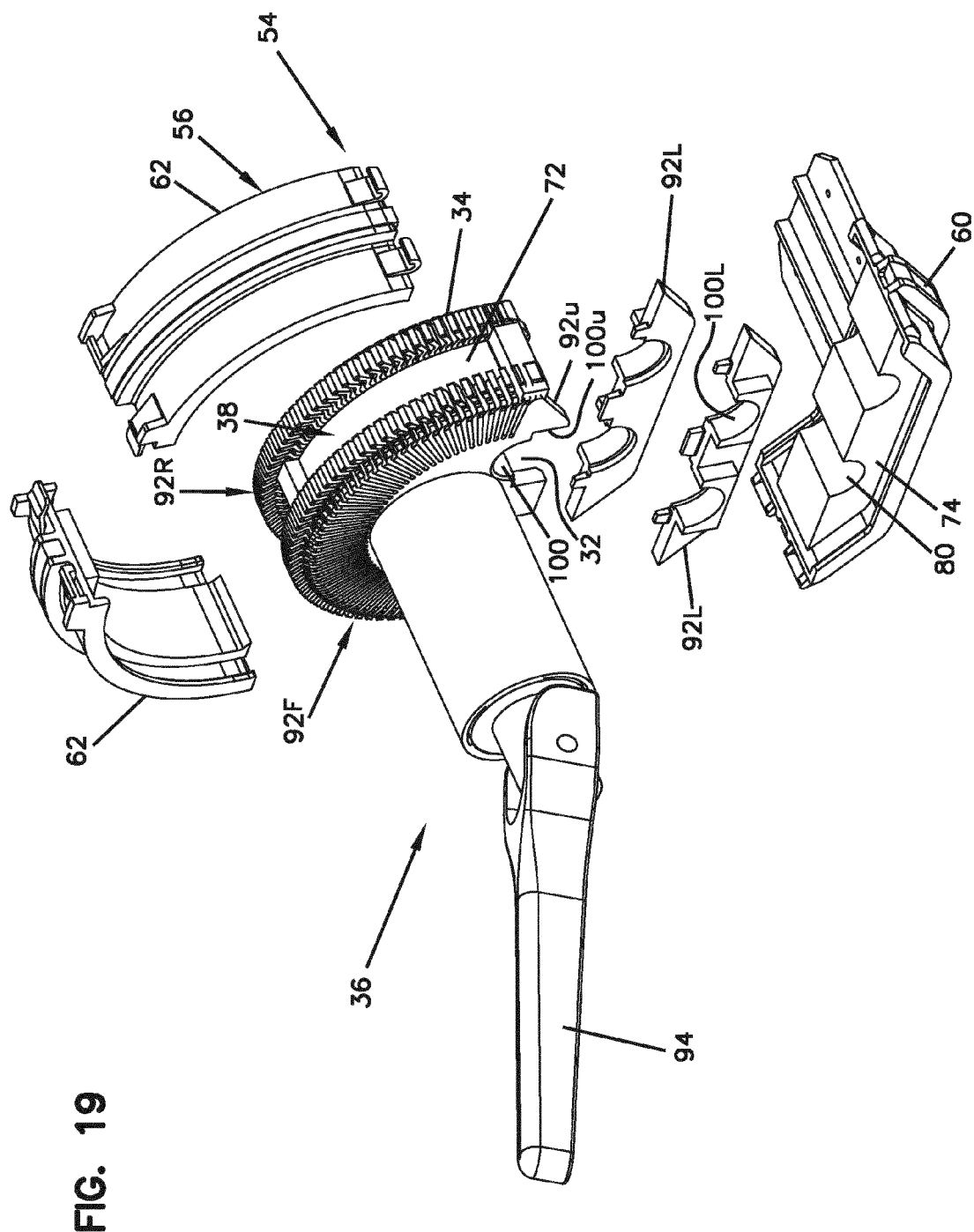
FIG. 19 is an exploded view of the cable sealing device of FIG. 7, the exploded view shows a wrap-around configuration for receiving cables through main central openings of the cable sealing device.

By disassembling the cable sealing unit 54 as shown at FIG. 19, cables can be easily laterally inserted into either the central cable ports 32 or the peripheral cable passage region 34. For example, main cables 88 can be laterally inserted into the central cable ports 32 by inserting the cables into the half-openings 82 defined by the bottom side of the central sealing member 72 and also into the upper half-openings 100U of the openings 100 defined by the upper plate portions 92U of the front compression plate 92F and the rear compression plate 92R. Subsequently, the lower plate portions 92L can be inserted under the cables and secured to the upper plate portions 92U such that the cables are captured within the openings 100 defined by the upper half-openings 100U defined by the upper plate portions 92U and the lower half-openings 100L defined by the lower plate portions 92L. Subsequently, the lower sealing member 74 carried by the base piece 60 is inserted under the cables and between the front compression plate 92F and the rear compression plate 92R such that the cables are captured within the half-openings 80, 82 respectively defined by the central sealing member 72 and the lower sealing member 74. The bridge pieces 62 are then hooked to the base piece 60 and latched together at the top of the perimeter casing 56 to lock the pieces of the perimeter casing together. As so assembled, the front compression plate 92F and the rear compression plate 92R are captured between respective front and rear flanges/lips of the perimeter casing 56.

Figure 20:
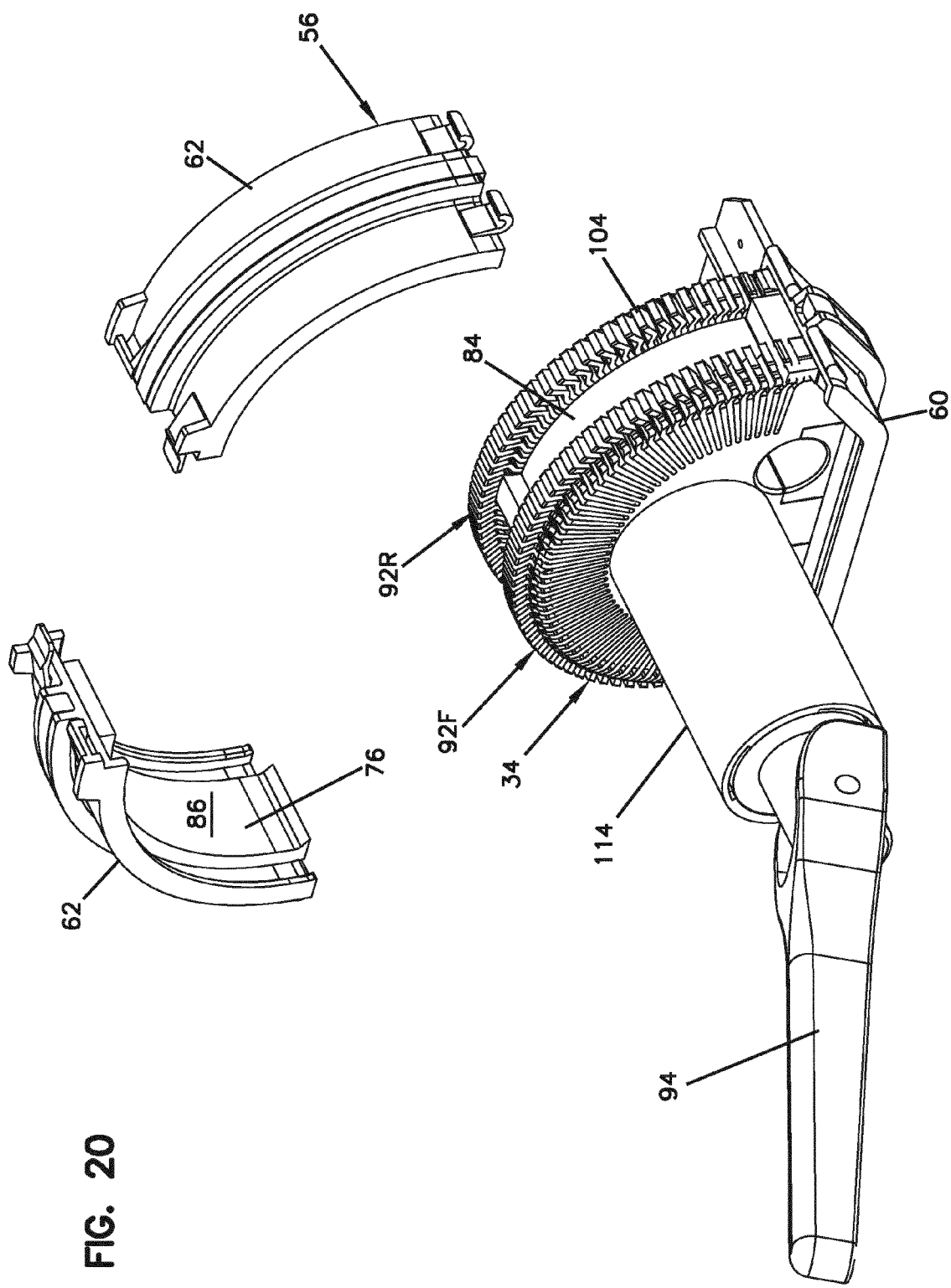
FIG. 20 is an exploded view of the sealing device of FIG. 7 showing a wrap-around configuration for receiving peripheral cables through a peripheral cable passage region.

To install peripheral cables 90 at the peripheral cable passage region 34, the cable sealing block can be disassembled as shown at FIG. 20. Peripheral cables 90 can then be inserted laterally between selected ones of the flexible cable pass-through members 104 of the front compression plate 92F and the rear compression plate 92R. During the insertion process, the flexible cable pass-through members 104 can flex apart to accommodate peripheral cables 90 of different sizes. The peripheral cables 90 can be laterally inserted between the flexible cable pass-through members 104 until the cables come into contact with the outwardly facing sealing surfaces 84 of the central sealing member 72. Thereafter, the upper sealing members 76 carried by the bridge pieces 62 can be inserted between the front compression plate 92F and the rear compression plate 92R such that the peripheral cables 90 are captured between the inwardly facing sealing surfaces 86 of the upper sealing members 76 and the outwardly facing sealing surfaces 84 of the central sealing member 72. The bridge pieces 62 are then hooked to the base piece 60 and latched together at the top of the perimeter casing 56 to lock the pieces of the perimeter casing together. As so assembled, the front compression plate 92F and the rear compression plate 92R are captured between respective front and rear flanges/lips of the perimeter casing 56.

Referring back to FIG. 12, the rear compression plate 92R includes a front extension 110 that fits inside a central opening 112 of the central sealing member 72. The front extension 110 and the central opening 112 have complementary shapes. In the depicted embodiment, the front extension 110 is integrally formed with the main body of the rear compression plate 92R.

Referring still to FIG. 12, the front compression plate 92F includes a front extension in the form of a spring housing 114. The spring housing 114 is depicted as having a tubular shape. The spring housing 114 functions as an enclosure for containing the spring 98. In the depicted embodiment, a rear end of the spring housing 114 is integrally formed with a main body of the front compression plate 92F.

The actuator 36 of the cable sealing device 30 further includes a linkage for forcing the front compression plate 92F and the rear compression plate 92R together so as to compress the cable seal arrangement 38. The linkage includes a central shaft 116 having a rear end coupled (e.g., integrally formed) with the rear compression plate 92R. The central shaft 116 extends through the front compression plate 92F and the spring housing 114. A front end 118 of the central shaft is pivotally connected to the cam lever 94 by a pivot pin 120. The central shaft 116 also extends through the spring 98 and through a slide ring 122 mounted within the spring housing 114. The slide ring is free to move axially within the spring housing 114 along the axis 96. However, a positive stop 124 is provided at a front end of the spring housing 114 stop for stopping forward movement of the slide ring 122 at the front end of the spring housing 114.

In certain embodiments, the spring 98 is housed within the spring housing 114 and is optionally pre-loaded (e.g., pre-compressed) with a substantial preload. The spring 98 is captured between the slide ring 122 and a front side of the front compression plate 92F. The spring housing 114 is not free to move axially relative to the front compression plate 92F. The preload on the spring 98 exists when the slide ring 122 is abutting the positive stop 124 provided at the front end of the spring housing 114.

In the non-actuated orientation, the cam lever 94 does not apply any axially load to the slide ring 122 and the slide ring is biased forwardly by the spring 98 against the positive stop 124 provided at the front of the spring housing 114. In this configuration, the spring is preloaded and held in a pre-loaded state through the cooperation of the slide ring 122 and the front side of the front compression plate 92F. Although the spring is pre-loaded, while the cam lever 94 is in the non-actuated position, no tension is applied to the central shaft 116 and no compressive load is generated for forcing the front compression plate 92F and the rear compression plate 92R together. To actuate the cable sealing device 30, the cam lever 94 is manually pivoted from the non-actuated position of FIG. 13 toward the actuated position of FIG. 14. As the cam lever 94 pivots toward the actuated position, an end cam surface 126 of the cam lever 94 applies a rearward force to the slide ring 122 in a direction along the axis 96. As the rearward force is applied to the slide ring 122 by the end cam surface 126, tension is applied to the central shaft 116 thereby causing the front compression plate 92F and the rear compression plate 92R to be compressed together. As the cam lever 94 is pivoted further toward the actuated position, the rearward force applied to the slide ring 122 increases thereby further increasing the tension applied to the central shaft 116 and the compressive load generated between the front compression plate 92F and the rear compression plate 92R. When the force generated by the cam lever 94 exceeds the preload on the spring 98, the slide ring 122 begins to slide rearwardly within the spring housing 114 thereby further compressing the spring 98.

Figure 21:
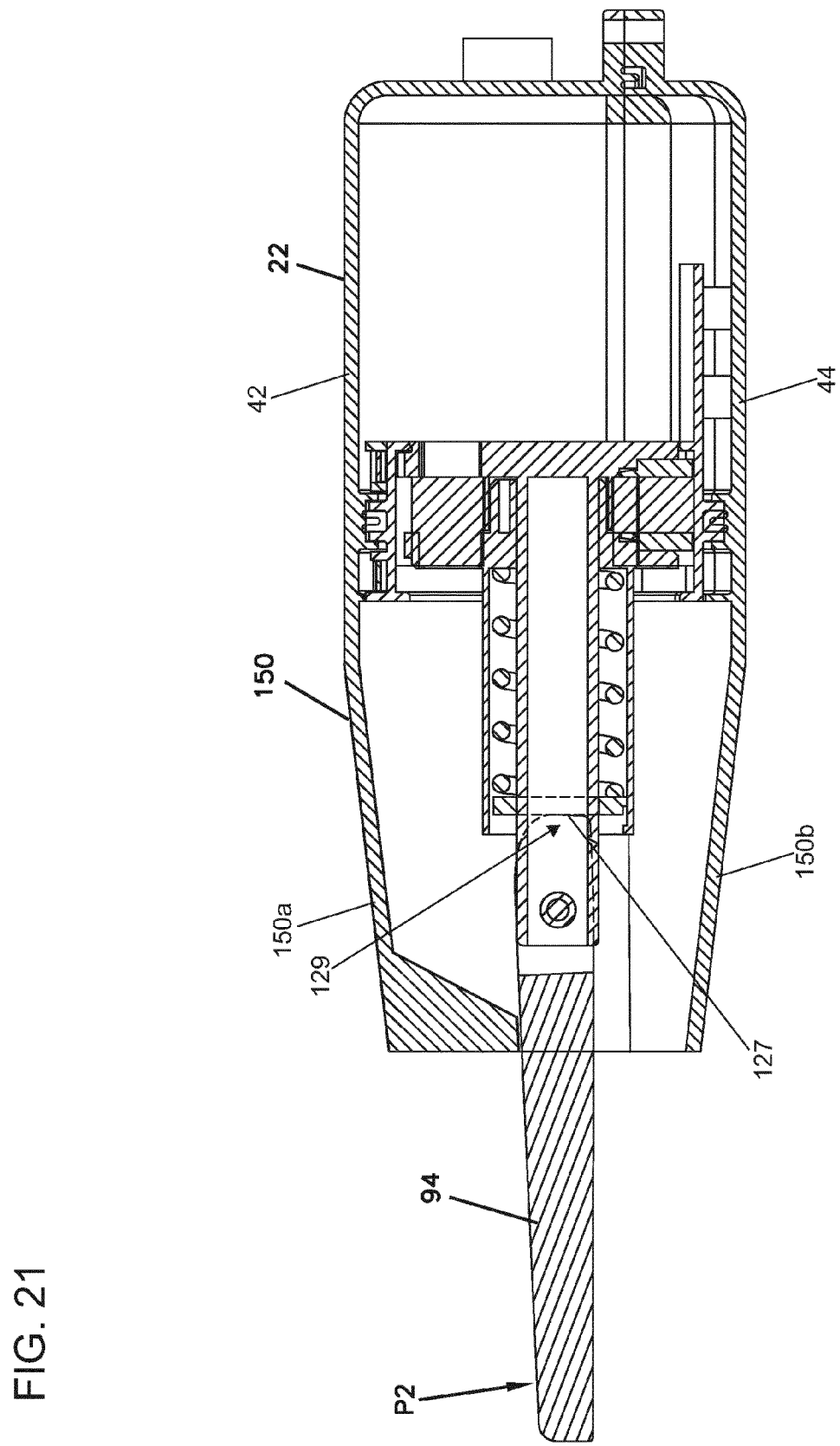
FIG. 21 shows an alternative telecommunications enclosure in accordance with the principles of the present disclosure.

In the depicted embodiment, the actuator 36 is configured such that the cable sealing arrangement is "normally" in the non-pressurized state and that movement of the cam lever 94 from the non-actuated position to the actuated position actively generates loading for compressing the sealing arrangement. In certain embodiments, the actuator can be configured such that the actuator prevents the enclosure from being closed if the actuator has not been actuated to pressurize the cable sealing arrangement. For example, as shown at the modified embodiment of FIG. 21, the cam lever 94 can be configured to interfere with closing the main housing 22 when the cam lever 94 is in the non-actuated position P1 and can be configured to not interfere with closing the main housing 22 when the cam lever 94 is in the actuated position P2. At FIG. 21, the main housing 22 of FIG. 1 has been modified through the addition of an axial extension 150 (e.g., a truncated conical skirt or collar that surrounds the cam lever 94) that projects axially outwardly from the second end 26 of the main housing 22. The axial extension 150 includes a first portion 150a integral with the cover 42 and a second portion 150b integral with the base 44. Interference between cam lever 94 and the first portion 150a of the extension 150 of the main housing 150 prevents the cam lever 94 from being in the non-actuated position P1 when the cover 42 is mounted to the base 44 to close the main housing 22. If a technician attempts to close the main housing 22 while the cam lever 94 is in the non-actuated position P1, the first portion 150a of the cover 42 will contact the cam lever 94 and force the cam lever 94 to move from the non-actuated position P1 to the actuated position P2. Thus, mounting of the cover 42 to the base 44 automatically moves the cam lever 94 from the non-actuated position P1 to the actuated position P2. This prevents the technician from closing the main housing 22 and leaving the site without having actuated the sealing arrangement 38.

Once the cam lever 94 is moved to the actuated position P2, a flat 127 at the end of the cam lever 172 cooperates with the slide ring 122 to provide an over-the-center type retention mechanism 129 for retaining the cam lever 94 in the actuated position P1. Thus, to de-pressurize the cable seal arrangement 38, the main housing 22 must first be opened and then a force must be applied to the cam lever 94 to overcome the retention mechanism 129 and move the cam lever 94 from the actuated position P2 to the non-actuated position P2. This makes it possible to opening the main housing 22 without de-pressurizing the cable seal arrangement 38. Specifically, when the main housing 22 is opened, the retention mechanism 129 retains the cam lever 94 in the actuated position P2 and the perimeter casing 56 and the compression plates 92F, 92R provide autonomous containment of the cable seal arrangement 38 thereby preventing the cable seal arrangement 38 from de-pressurizing even though the main housing 22 is open.

When the main housing 22 is closed with the cam lever 94 in the actuated position P1, pivotal movement of the cam lever 94 is obstructed by the axial extension 150 such that the cam lever 94 is prevented from being pivoted fully from the actuated position P2 to the non-actuated position P1. Thus, unintentional de-pressurization of the cable seal arrangement 38 while the main housing 22 is closed is prevented.

It will be appreciated that sealing members of the present disclosure may be formed of any one or more of a variety of sealing materials. Elastomers, including natural or synthetic rubbers (e.g., EPDM rubber or silicone rubber) can be used. In other embodiments, polymeric foam (e.g., open cell or closed cell) such as silicone foam can be used. In still other embodiments, the sealing members may comprise gel and/or gel combined with another material such as an elastomer. The gel may, for example, comprise silicone gel, urea gel, urethane gel, thermoplastic gel, or any suitable gel or geloid sealing material. Gels are normally substantially incompressible; when placed under a compressive force and normally flow and conform to their surroundings thereby forming sealed contact with other surfaces. Example gels include oil-extended polymers. The polymer may, for example, comprise an elastomer, or a block copolymer having relatively hard blocks and relatively elastomeric blocks. Example copolymers include styrene-butadiene or styrene-isoprene di-block or tri-block copolymers. In still other embodiments, the polymer of the gel may include one or more styrene-ethylene-propylene-styrene block copolymers. Example extender oils used in example gels may, for example, be hydrocarbon oils (e.g., paraffinic or naphthenic oils or polypropene oils, or mixtures thereof). The sealing members can also include additives such as moisture scavengers, antioxidants, tackifiers, pigments and/or fungicides. In certain embodiments, sealing members in accordance with the principles of the present disclosure have ultimate elongations greater than 100 percent with substantially elastic deformation to an elongation of at least 100 percent. In other embodiments, sealing members in accordance with the principles of the present disclosure have ultimate elongations of at least 200 percent, or at least 500 percent, or at least 1000 percent. Ultimate elongation can be determined by the testing protocol set forth at ASTM D412.

The perimeter casing as well as the compression plates can be formed of one or more of a variety of materials capable of constraining the cable sealing arrangement while the cable sealing arrangement is loaded under pressure. Example materials include one or more plastic materials such as polypropylene, polyamide, polycarbonate, acrylobutadiene-styrene (ABS) or the like. Additionally or alternatively, such members may be formed from one or more metals such as aluminum or steel.

PARTS LIST

P1 non-actuated position
P2 actuated position
S1 first spaces
S2 second spaces
SL stroke length
20 telecommunications enclosure
22 main housing
24 first end
26 second end
28 opening
30 cable sealing device
32 central cable port
34 peripheral cable passage region
36 actuator
38 cable seal arrangement
40 interior region
42 cover piece
44 base piece
46 base flange
48 groove
50 cover flange
52 seal compression member
54 cable sealing unit
56 perimeter casing
58 outer sealing element
60 base piece
61 outer channel
62 bridge piece
63 outer channel
65 lower ends
66 lower hook
68 catch
70 upper latch
71 upper ends
72 central sealing member
74A inner portion
74B outer portion
74C radial leg
74 lower sealing member
76A inner portion
76B outer portion
76C radial leg portion
76 upper sealing member
80 half-opening
82 half-opening
84 outwardly facing sealing surface
86 inwardly facing sealing surface
88 main cable
90 peripheral cable
92F front compression plate
92L lower plate portion
92R rear compression plate
92U upper plate portion
94 cam lever
96 axis
98 spring
100L lower half-opening
100U upper half-opening
100 opening
102 base region
104 flexible cable pass-through member
106 base end
108 free end
110 front extension
112 central opening
114 spring housing
116 central shaft
118 front end
120 pivot pin
122 slide ring
124 positive stop
126 end cam surface
127 flat
129 retention mechanism
150 axial extension
150a first portion of axial extension
150b second portion of axial extension

The invention claimed is:

1. A cable sealing device for providing a seal about a cable, the cable sealing device comprising a cable seal arrangement that is pressurized to seal the cable, wherein the cable sealing device includes an autonomous containment structure for laterally and axially containing the sealing arrangement, the autonomous containment structure including a moveable portion that is moved to an actuated position to pressurize the cable seal arrangement, the cable sealing device also including a retention mechanism for retaining the moveable portion in the actuated position, the autonomous containment structure further including an autonomous perimeter casing mounted over the sealing arrangement for laterally containing the cable sealing arrangement such that the cable sealing arrangement remains pressurized when the moveable portion is in the actuated position independent of whether the cable sealing device is mounted within an enclosure, the cable sealing device having a wrap-around configuration and a perimeter seal that extends about an exterior of the autonomous perimeter casing, wherein the perimeter seal is connected to the cable seal arrangement by legs that extend through the autonomous perimeter casing.

2. The cable sealing device of claim 1, wherein the autonomous perimeter casing has a rigid construction and includes a base piece that extends under the cable seal arrangement and two bridge pieces that extend over the cable seal arrangement.

3. The cable sealing device of claim 2, wherein the bridge pieces have lower ends hooked to the base piece and upper ends that fasten together.

4. The cable sealing device of claim 3, wherein the moveable portion includes first and second compression plates for axially compressing the cable sealing arrangement, and wherein the cable sealing arrangement includes a main central sealing member positioned axially between the first and second compression plates, a lower sealing member positioned between the main central sealing member and the base piece, and upper sealing members positioned between the main central sealing members and the bridge pieces.

5. The cable sealing device of claim 4, wherein the lower sealing member is carried by the base piece when the cable sealing device is disassembled, and the upper sealing members are carried by the bridge pieces when the cable sealing device is disassembled.

6. The cable sealing device of claim 1, wherein the moveable portion includes first and second compression plates for axially compressing the cable sealing arrangement, and wherein the first and second compression plates are captured within the autonomous perimeter casing.

7. The cable sealing device of claim 6, wherein the first and second compression plates are captured between flanges of the perimeter casing.

8. A re-enterable telecommunications enclosure including the cable sealing device of claim 1, the telecommunications enclosure including first and second housing pieces that are moved relative to one another to re-enter the telecommunications enclosure, the cable sealing device being mounted inside an opening defined at least in part by the first and second housing pieces, the telecommunications enclosure including a seal that surrounds an exterior of the autonomous perimeter casing and that is compressed between the first and second housing pieces and the autonomous perimeter casing.

9. The re-enterable telecommunications enclosure of claim 8, wherein the telecommunication enclosure can be re-entered without decompressing the cable seal arrangement within the autonomous perimeter casing.

10. The re-enterable telecommunications enclosure of claim 8, wherein the first and second housing pieces include a base piece and a cover piece having flanges that are secured together.

11. The re-enterable telecommunications enclosure of claim 8, wherein the retention mechanism of the cable sealing device is part of an actuator including a cam lever having a cam surface and an over-the-center locking configuration.

12. A re-enterable telecommunications enclosure including the cable sealing device of claim 1, the telecommunications enclosure being configured such that when the telecommunications enclosure is re-entered, a seal surrounding the cable sealing device is decompressed while the cable seal arrangement inside the autonomous perimeter casing remains pressurized.

13. The cable sealing device of claim 1, wherein the perimeter seal, the cable seal arrangement and the legs are integrated with the autonomous perimeter casing through a co-molding process.

* * * * *